(12) United States Patent
Nishino et al.

(10) Patent No.: US 10,395,847 B2
(45) Date of Patent: Aug. 27, 2019

(54) PHOTOELECTRIC CONVERSION ELEMENT

(71) Applicant: Fujikura Ltd., Tokyo (JP)

(72) Inventors: Yuta Nishino, Sakura (JP); Keisuke Naka, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/775,117

(22) PCT Filed: Nov. 18, 2016

(86) PCT No.: PCT/JP2016/084215
§ 371 (c)(1),
(2) Date: May 10, 2018

(87) PCT Pub. No.: WO2017/086424
PCT Pub. Date: May 26, 2017

(65) Prior Publication Data
US 2018/0330892 A1    Nov. 15, 2018

(30) Foreign Application Priority Data
Nov. 20, 2015    (JP) ................................ 2015-227550

(51) Int. Cl.
*H01G 9/20*    (2006.01)
*H01L 51/44*    (2006.01)

(52) U.S. Cl.
CPC ......... *H01G 9/2077* (2013.01); *H01G 9/2081* (2013.01); *H01L 51/441* (2013.01);
(Continued)

(58) Field of Classification Search
CPC ........................... H01G 9/2077; H01G 9/2081
See application file for complete search history.

(56) References Cited

U.S. PATENT DOCUMENTS

2012/0103400 A1    5/2012    Chiba et al.
2015/0372248 A1*   12/2015   Okada .................. H01L 51/441
                                                            136/256

FOREIGN PATENT DOCUMENTS

CN    102460821 A    5/2012
CN    104781895 A    7/2015
(Continued)

OTHER PUBLICATIONS

International Search Report dated Dec. 20, 2016, issued in counterpart International Application No. PCT/JP2016/084215 (1 page).
(Continued)

*Primary Examiner* — Eli S Mekhlin
(74) *Attorney, Agent, or Firm* — Westerman, Hattori, Daniels & Adrian, LLP

(57) ABSTRACT

An element includes a first substrate and a layer including a first conductive layer with a first conductive portion and a second conductive layer. The element includes a cell including the first conductive portion, a second substrate and a sealing portion. A groove is formed between the first and second conductive layers, the element includes an insulating layer provided between the sealing portion and the first substrate, and an outer circumferential edge of the insulating layer is provided to surround the entire sealing portion. The insulating layer covers and hides a portion of the first conductive layer, which protrudes outside the sealing portion, inside from the outer circumferential edge of the insulating layer and outside the sealing portion, enters the groove and covers a part of the second conductive layer, and the rest of the second conductive layer is exposed.

6 Claims, 8 Drawing Sheets

(52) U.S. Cl.
CPC ......... *H01L 51/448* (2013.01); *H01G 9/2031* (2013.01); *H01G 9/2059* (2013.01)

(56) References Cited

FOREIGN PATENT DOCUMENTS

| | | |
|---|---|---|
| EP | 2 451 005 A1 | 5/2012 |
| EP | 2 892 107 A1 | 7/2015 |
| EP | 2 955 781 A1 | 12/2015 |
| EP | 3 089 182 A1 | 11/2016 |
| JP | 5451920 B1 | 3/2014 |
| JP | 2014-211951 A | 11/2014 |
| JP | 2015046222 A | 3/2015 |
| WO | 2011/001815 A1 | 1/2011 |
| WO | WO-2014122859 A1 * | 8/2014 ........... H01L 51/441 |
| WO | 2015/098914 A1 | 7/2015 |

OTHER PUBLICATIONS

Extended Search Report dated Jul. 12, 2019, issued in counterpart EP Application No. 16866424.1 (9 pages).

\* cited by examiner

PHOTOELECTRIC CONVERSION ELEMENT

TECHNICAL FIELD

The present invention relates to a photoelectric conversion element.

BACKGROUND ART

As a photoelectric conversion element, a photoelectric conversion element using a dye has attracted attention since it is inexpensive and can obtain high photoelectric conversion efficiency.

For example, a dye-sensitized solar cell element described in Patent Document 1 described below is known as such a photoelectric conversion element using the dye. The dye-sensitized solar cell element includes a substrate, and at least one photoelectric conversion cell, and the photoelectric conversion cell includes a first transparent conductive layer provided on the substrate, a counter substrate facing the first transparent conductive layer, and a ring-shaped sealing portion joining the first transparent conductive layer and the counter substrate. Further, a second transparent conductive layer is provided on the outside of the first transparent conductive layer on the substrate, and a groove is famed between the second transparent conductive layer and the first transparent conductive layer. Here, an insulating material enters the groove extending to the outside of the sealing portion, and the insulating material covers a part of the second transparent conductive layer.

CITATION LIST

Patent Document

Patent Document 1: JP 2014-211951 A (FIG. 10)

SUMMARY OF THE INVENTION

Problem to be Solved by the Invention

However, the dye-sensitized solar cell element described in the above-mentioned Patent Document 1 has the following problems.

That is, in the dye-sensitized solar cell element described in the above-mentioned Patent Document 1, there is a portion of the first transparent conductive layer, which is exposed between the sealing portion and the insulating material in a case of observing the dye-sensitized solar cell element from a direction orthogonal to one surface of the substrate, and thus, polarization does not occur in the first transparent conductive layer. For this reason, the dye-sensitized solar cell element described in the above-mentioned Patent Document 1 is capable of suppressing electrostatic charge, and thus, is capable of sufficiently suppressing an adverse effect of the electrostatic charge on peripheral devices. However, there is a room for improvement in the dye-sensitized solar cell element described in the above-mentioned Patent Document 1 from the viewpoint of durability.

For this reason, a photoelectric conversion element having excellent durability while suppressing the electrostatic charge has been hoped.

The invention has been made in consideration of the circumstances described above, and an object of the invention is to provide a photoelectric conversion element having excellent durability while suppressing the electrostatic charge.

Means for Solving Problem

The present inventors have intensively conducted studies in order to solve the problems described above. First, in the dye-sensitized solar cell element described in the above-mentioned Patent Document 1, the insulating material enters the groove extending to the outside of the sealing portion of the photoelectric conversion cell, but a part of the first transparent conductive layer and a part of the second transparent conductive layer are exposed in a case of observing the photoelectric conversion element from the direction orthogonal to the one surface of the substrate. Here, in order to improve durability in the dye-sensitized solar cell element, the entire exposed portion of the first transparent conductive layer and the second transparent conductive layer may be covered and hidden with the insulating material. However, in this case, it is not possible to sufficiently suppress the electrostatic charge. Therefore, the present inventors has repeatedly conducted intensive studies in order to realize a photoelectric conversion element having excellent durability while suppressing the electrostatic charge, and, as a result, found that the problems described above can be solved by the following invention.

That is, the invention is a photoelectric conversion element, including a first substrate; a conductive layer provided on one surface of the first substrate, the conductive layer including a first conductive layer which includes at least one first conductive portion, and a second conductive layer which is provided on the outside of the first conductive layer, and includes at least one second conductive portion; wherein the photoelectric conversion element has at least one photoelectric conversion cell, the photoelectric conversion cell includes, the first conductive portion, a second substrate facing the first conductive portion, and a ring-shaped sealing portion joining the first substrate and the second substrate, the first conductive layer and the second conductive layer are arranged via a first groove, the photoelectric conversion element includes an insulating layer, the insulating layer is provided to overlap with the sealing portion between the sealing portion of the at least one photoelectric conversion cell and the first substrate, an outer circumferential edge of the insulating layer is provided on the outside from the sealing portion to surround the entire sealing portion of the at least one photoelectric conversion cell, in a case of observing the photoelectric conversion element from a direction orthogonal to the one surface of the first substrate, the insulating layer covers and hides a portion of the first conductive layer, which protrudes to the outside of the sealing portion, on the inside from the outer circumferential edge of the insulating layer and on the outside of the sealing portion, and enters the first groove and covers a part of the second conductive layer, and the rest of the second conductive layer is exposed.

According to the photoelectric conversion element, it is possible to have excellent durability while suppressing electrostatic charge.

Meanwhile, the present inventors assume the reason that the electrostatic charge can be suppressed by the photoelectric conversion element of the invention, as follows. That is, a part of the second conductive layer provided on the outside of the first conductive portion included in the at least one photoelectric conversion cell is covered with the insulating layer, and the rest of the second conductive layer is exposed.

For this reason, there is no electrostatic charge in the rest of the second conductive layer, and the electrostatic charge with respect to the insulating layer is suppressed. For this reason, the electrostatic charge with respect to the photoelectric conversion element is sufficiently suppressed. Thus, the present inventors assume that the electrostatic charge can be suppressed according to the photoelectric conversion element of the invention.

In addition, the present inventors assume the reason that it is possible to have excellent durability by the photoelectric conversion element of the invention, as follows. That is, in the photoelectric conversion element of the invention, an outer circumferential edge of the insulating layer is provided on the outside from the sealing portion to surround the entire sealing portion of the at least one photoelectric conversion cell, in a case of observing the photoelectric conversion element from the direction orthogonal to the one surface of the first substrate, and the insulating layer covers and hides the portion of the first conductive layer, which protrudes to the outside of the sealing portion, on the inside from the outer circumferential edge of the insulating layer and on the outside of the sealing portion. For this reason, the infiltration of moisture on the inside from the outer circumferential edge of the insulating layer is sufficiently suppressed. Further, at this time, a route of moisture from an interface between the second conductive layer and the insulating layer to the photoelectric conversion cell is elongated by the insulating layer. Further, the insulating layer enters the first groove. For this reason, the infiltration of moisture into the photoelectric conversion cell is sufficiently suppressed. Thus, the present inventors assume that it is possible to have excellent durability according to the photoelectric conversion element of the invention.

In addition, in the photoelectric conversion element described above, an end portion of the first groove may reach an outer circumferential edge of the conductive layer, and the insulating layer may also enter the end portion of the first groove.

In this case, since the insulating layer also enters the end portion of the first groove, the infiltration of moisture into the photoelectric conversion cell through the end portion of the first groove can be sufficiently suppressed.

In addition, in the photoelectric conversion element described above, it is preferable that the at least one photoelectric conversion cell be constituted by a plurality of photoelectric conversion cells, and a second groove separating the first conductive portions adjacent to each other to form the same number of first conductive portions as the number of photoelectric conversion cells together with the first groove be famed in the first conductive layer, and the insulating layer also enter the second groove.

In this case, since the insulating layer also enters the second groove formed in the first conductive layer, the filtration of moisture into the plurality of photoelectric conversion cells through the second groove is sufficiently suppressed.

In the photoelectric conversion element described above, it is preferable that the insulating layer enter the entire first groove.

In this case, durability of a photoelectric conversion element 100 can be further improved.

In the photoelectric conversion element described above, it is preferable that when a width of a portion in which a width between an outer circumferential edge of the second conductive portion and the first groove is maximized is set to Wmax, and a width of the exposed second conductive portion is set to W1, W1/Wmax be 0.1 or more.

In this case, the durability of the photoelectric conversion element can be further improved, and the electrostatic charge to the photoelectric conversion element can be more sufficiently suppressed.

In the photoelectric conversion element described above, it is preferable that the insulating layer cover and hide the entire portion of the first conductive layer, which protrudes to the outside of the sealing portion, on the outside of the sealing portion.

In this case, photoelectric conversion characteristics of the photoelectric conversion element can be further improved.

Effect of the Invention

According to the invention, a photoelectric conversion element having excellent durability while suppressing electrostatic charge is provided.

MODE(S) FOR CARRYING OUT THE INVENTION

Figure 1:
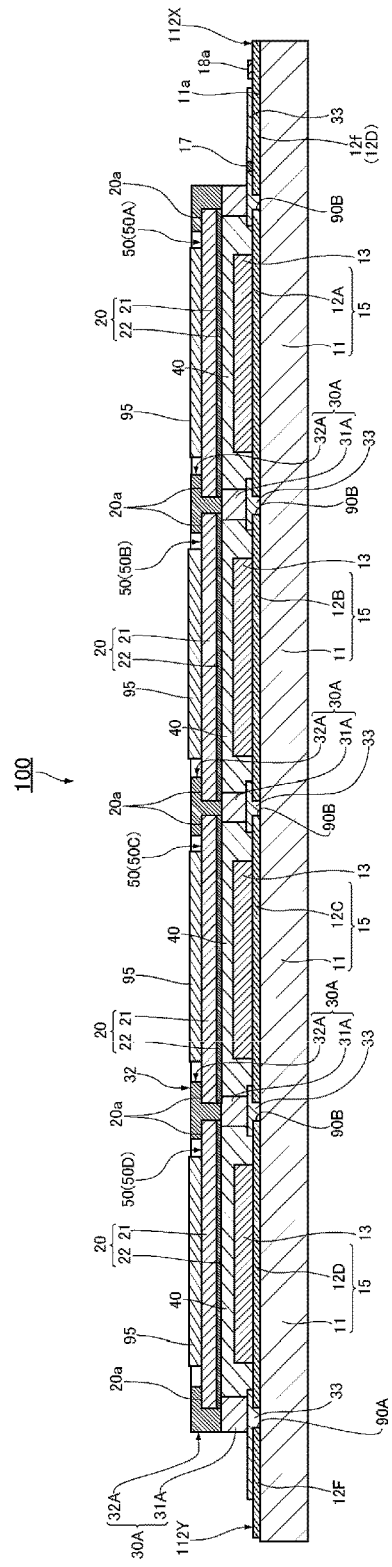
FIG. 1 is a cross-sectional view illustrating a first embodiment of a photoelectric conversion element of the invention.
Figure 4:
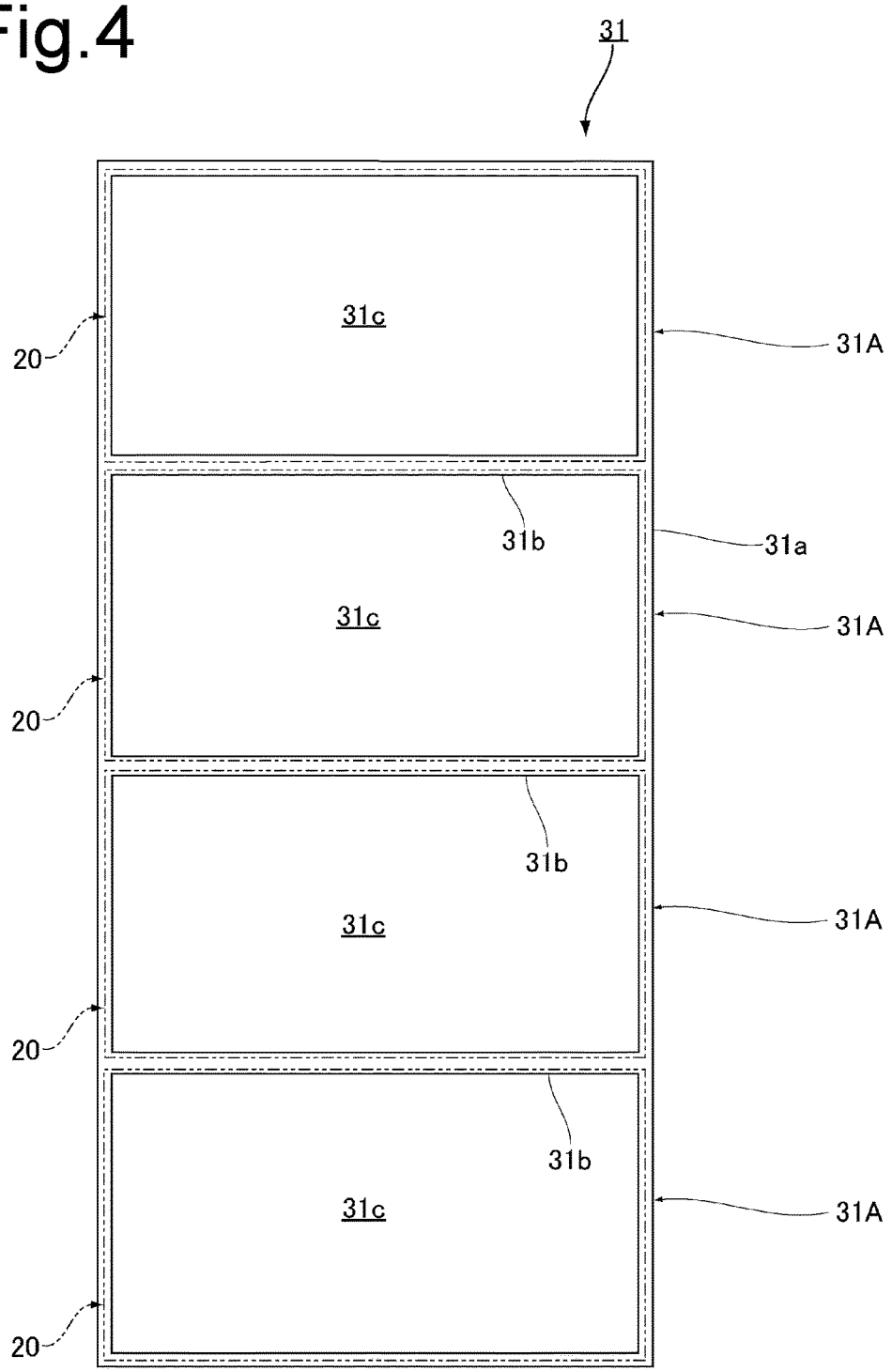
FIG. 4 is a plan view illustrating a first integrated sealing portion of FIG. 1.
Figure 5:
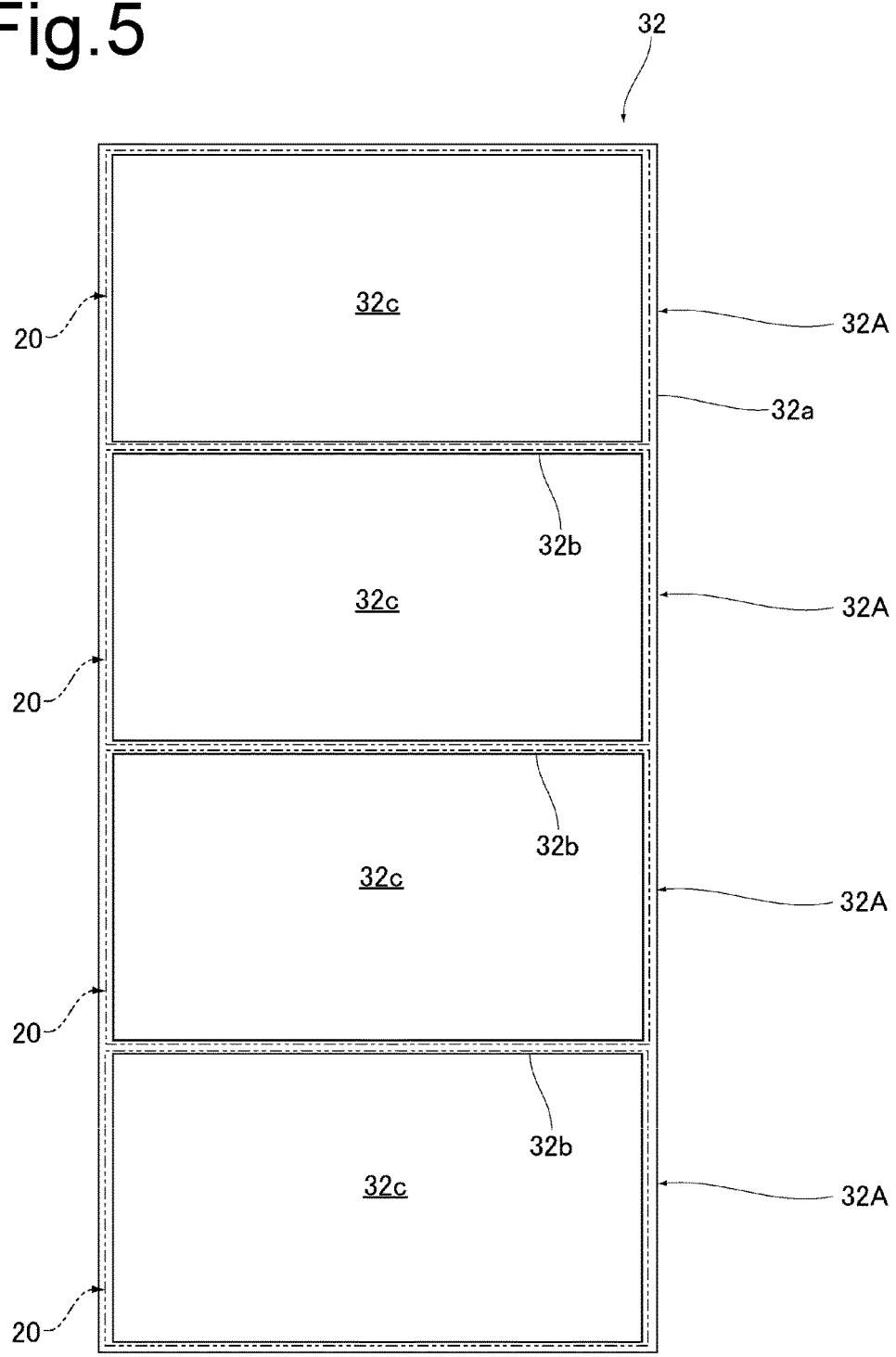
FIG. 5 is a plan view illustrating a second integrated sealing portion of FIG. 1.
Figure 6:
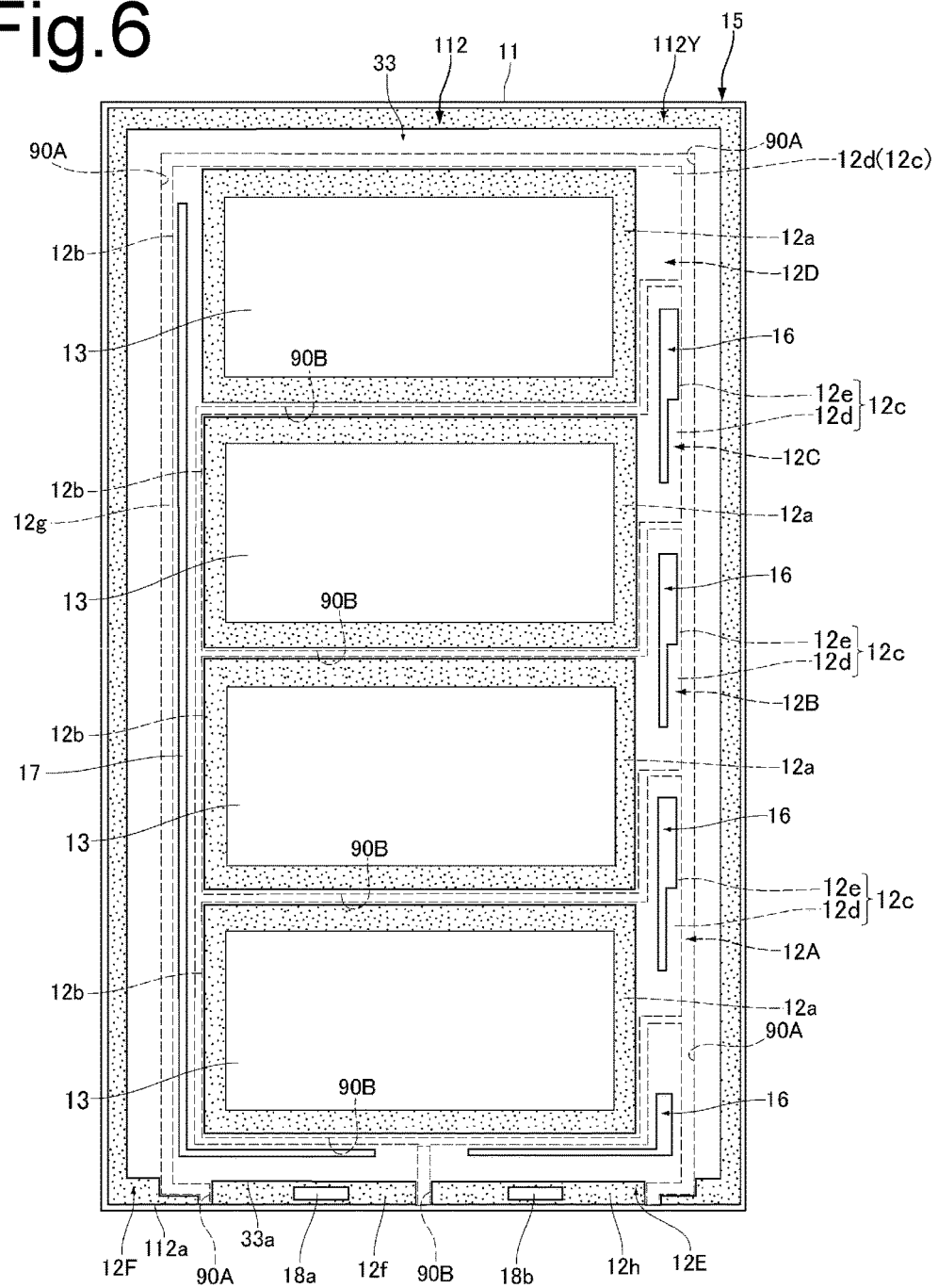
FIG. 6 is a plan view illustrating a part of the photoelectric conversion element of FIG. 2.

Hereinafter, preferred embodiments of a photoelectric conversion element of the invention will be described in detail with reference to FIG. 1 to FIG. 6. FIG. 1 is a cross-sectional view illustrating a first embodiment of the photoelectric conversion element of the invention, FIG. 2 is a plan view illustrating the first embodiment of the photoelectric conversion element of the invention, FIG. 3 is a plan view illustrating a pattern of a conductive layer of the photoelectric conversion element of FIG. 1, FIG. 4 is a plan view illustrating a first integrated sealing portion of FIG. 1, FIG. 5 is a plan view illustrating a second integrated sealing portion of FIG. 1, and FIG. 6 is a plan view illustrating a part of the photoelectric conversion element of FIG. 2.

Figure 2:
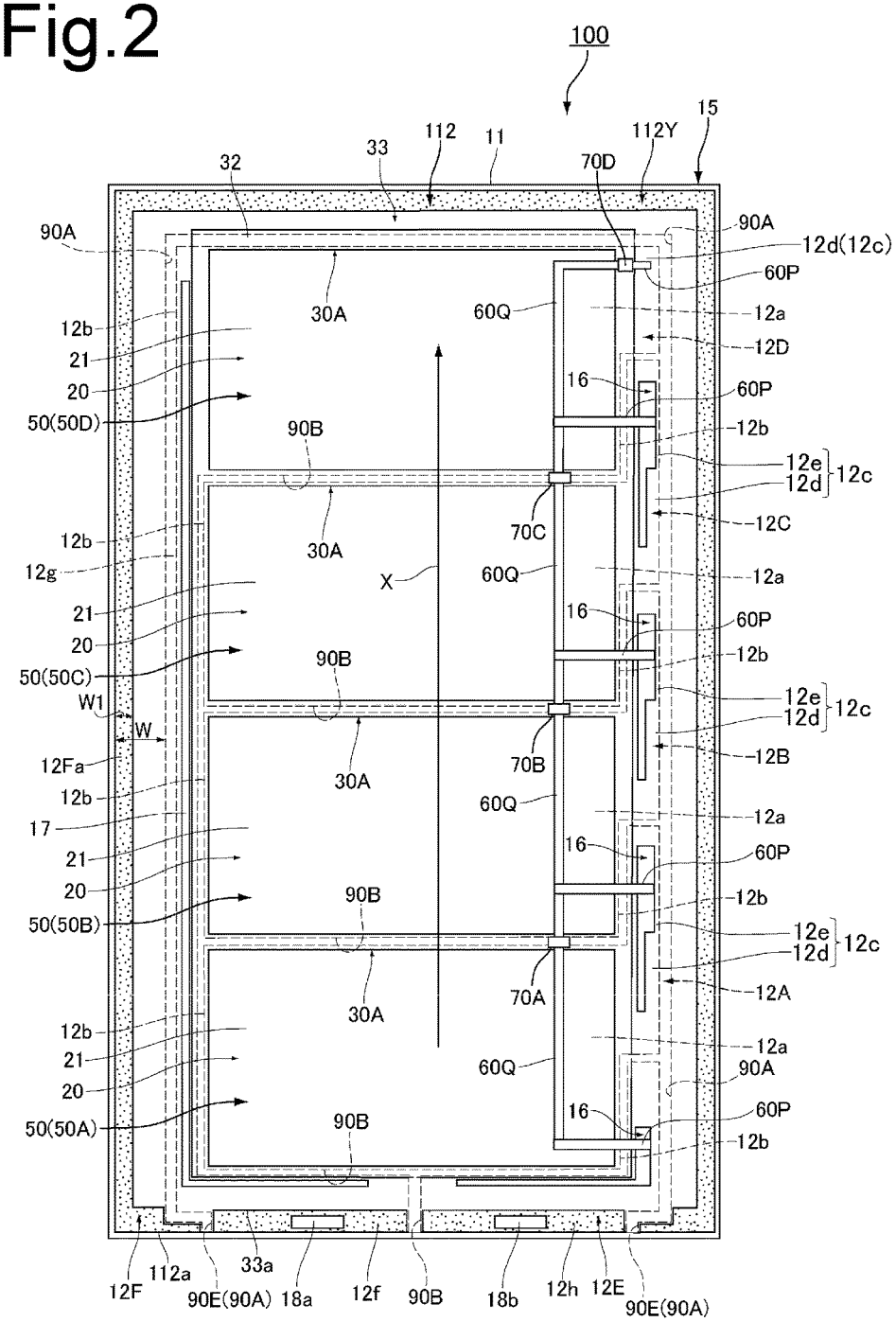
FIG. 2 is a plan view illustrating the first embodiment of the photoelectric conversion element of the invention.
Figure 3:
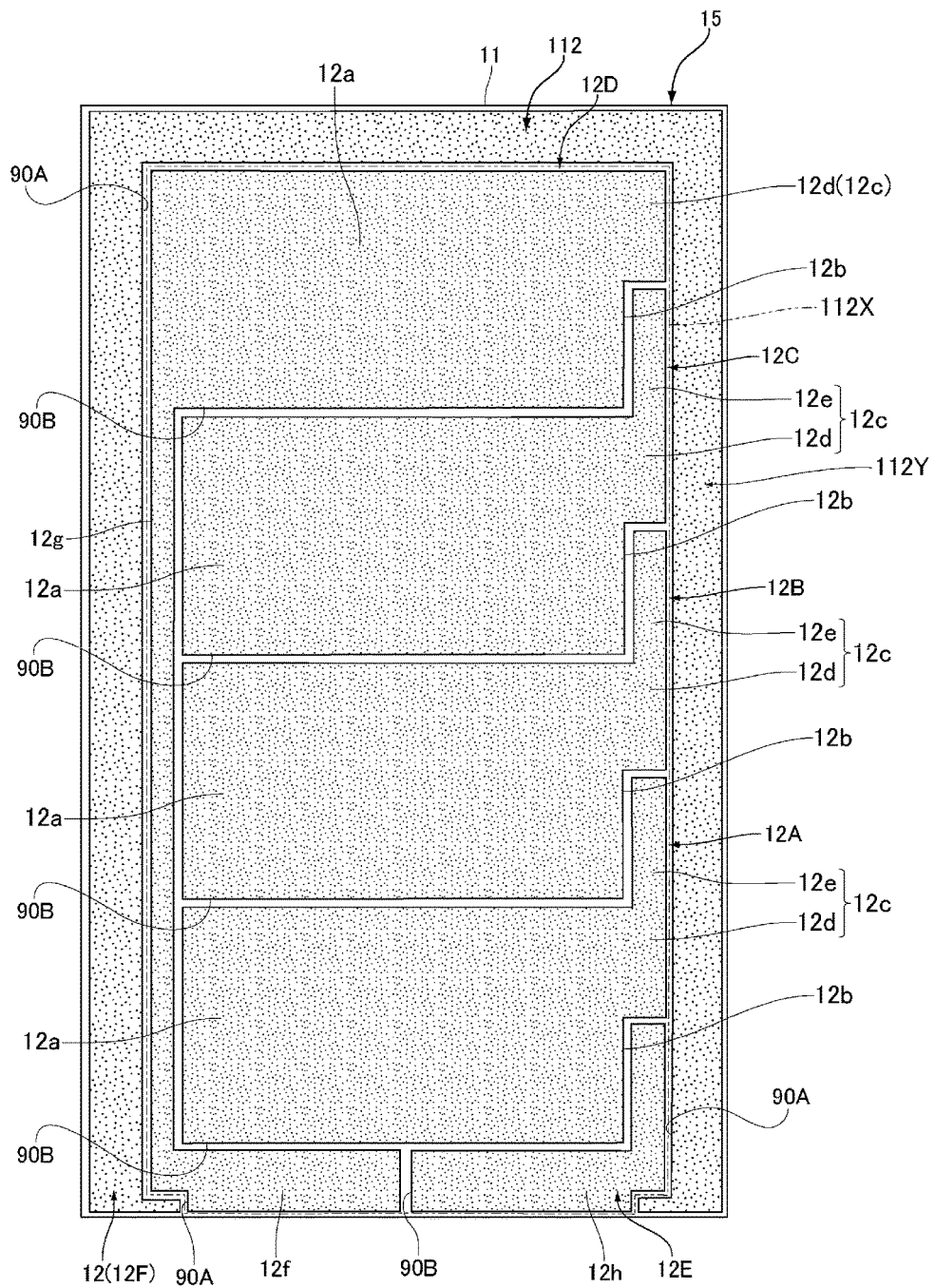
FIG. 3 is a plan view illustrating a pattern of a conductive layer of the photoelectric conversion element of FIG. 1.

As illustrated in FIG. 1 to FIG. 3, a photoelectric conversion element 100 comprises a conductive substrate 15 which has a transparent substrate 11 as a first substrate, and a transparent conductive layer 112 as a conductive layer which is provided on one surface 11a of the transparent substrate 11. The transparent conductive layer 112 includes a first transparent conductive layer 112X which includes a first transparent conductive portion 12E and a plurality of (four in FIG. 3) first transparent conductive portions 12A to 12D as first conductive portions, and a second transparent conductive layer 112Y which is provided on the outside of the first transparent conductive layer 112X and includes at least one (one in FIG. 3) second transparent conductive portion 12F as a second conductive portion. Meanwhile, as illustrated in FIG. 3, the first transparent conductive layer 112X is a transparent conductive layer in a region surrounded by a two-dotted chain line. In addition, in this embodiment, the first transparent conductive layer 112X constitutes a first conductive layer, and the second transparent conductive layer 112Y constitutes a second conductive layer.

The first transparent conductive layer 112X and the second transparent conductive layer 112Y are arranged via a first groove 90A, and a second groove 90B separating the first transparent conductive portions adjacent to each other to form the plurality of first transparent conductive portions 12A to 12D and the first transparent conductive portion 12E together with the first groove 90A is formed in the first transparent conductive layer 112X.

The photoelectric conversion element 100 comprises a plurality (four in FIG. 1) of photoelectric conversion cells (hereinafter, simply referred to as "cells" in some cases) 50 and a plurality of cells 50 are connected in series by a wiring material 60P (see FIG. 2). Hereinafter, for the convenience of description, four cells 50 in the photoelectric conversion element 100 are referred to as cells 50A to 50D in some cases.

Each of the plurality of cells 50 comprises the first transparent conductive portion 12A, 12B, 12C, or 12D, at least one oxide semiconductor layer 13 provided on the first transparent conductive portion 12A, 12B, 12C, or 12D, a counter electrode 20 facing the first transparent conductive portion 12A, 12B, 12C, or 12D, as a second substrate, and a ring-shaped sealing portion 30A joining the transparent substrate 11 and the counter electrode 20. The oxide semiconductor layer 13 is disposed on the inside of the ring-shaped sealing portion 30A. In addition, a dye is supported on the oxide semiconductor layer 13. An electrolyte 40 is disposed between the first transparent conductive portion 12A, 12B, 12C, or 12D and the counter electrode 20, and the electrolyte 40 is surrounded by the ring-shaped sealing portion 30A.

The counter electrode 20 comprises a metal substrate 21, and a catalyst layer 22 which is provided on the first transparent conductive portion 12A, 12B, 12C, or 12D side of the metal substrate 21 and promotes a catalytic reaction. In addition, in the adjacent two cells 50, the counter electrodes 20 are separated from each other. Meanwhile, a desiccant 95 may be provided on the counter electrode 20 of each of the cells 50.

The transparent substrate 11 is used as a common transparent substrate of the cells 50A to 50D.

As illustrated in FIG. 3, all of the first transparent conductive portions 12A to 12D include a quadrangular-shaped main body portion 12a including a side edge portion 12b, and a protruding portion 12c laterally protruding from the side edge portion 12b of the main body portion 12a. Meanwhile, the shape of the main body portion 12a is not limited to a quadrangular shape, and may be various shapes.

As illustrated in FIG. 2, in the cell 50C, the protruding portion 12c of the first transparent conductive portion 12C includes a projecting portion 12d which laterally projects to an arrangement direction X of the cells 50A to 50D, and a facing portion 12e which extends from the projecting portion 12d and faces the main body portion 12a of the adjacent cell 50D via the second groove 90B.

In the cell 50B as well, the protruding portion 12c of the first transparent conductive portion 12B has the projecting portion 12d and the facing portion 12e. In addition, in the cell 50A as well, the protruding portion 12c of the first transparent conductive portion 12A has the projecting portion 12d and the facing portion 12e.

Meanwhile, the cell 50D is connected with the cell 50C already and there is no other cell 50 to be connected with respect to the cell 50D. For this reason, in the cell 50D, the protruding portion 12c of the first transparent conductive portion 12D does not have a facing portion 12e. In other words, the protruding portion 12c of the first transparent conductive portion 12D is constituted by only the projecting portion 12d.

However, the first transparent conductive portion 12D further has a first current extracting portion 12f for extracting the current generated in the photoelectric conversion element 100 to the outside and a connecting portion 12g which connects the first current extracting portion 12f and the main body portion 12a and extends along the side edge portion 12b of the first transparent conductive portions 12A to 12C. The first current extracting portion 12f is disposed on the side opposite to the first transparent conductive portion 12B with respect to the first transparent conductive portion 12A.

The first transparent conductive portion 12E includes a second current extracting portion 12h for extracting the current generated in the photoelectric conversion element 100 to the outside, and the second current extracting portion 12h of the first transparent conductive portion 12E is arranged on the side opposite to the first transparent conductive portion 12B with respect to the first transparent conductive portion 12A.

The first current extracting portion 12f and the second current extracting portion 12h of the first transparent conductive portion 12E are arranged to be adjacent to each other via the second groove 90B.

In addition, connecting terminals 16 are provided on each of the protruding portion 12c of the first transparent conductive portions 12A to 12C and the first transparent conductive portion 12E. The connecting terminal 16 is constituted by a wiring material connecting portion to which the wiring material 60P is connected and a wiring material non-connecting portion to which the wiring material 60P is not connected.

As illustrated in FIG. 1, the sealing portion 30A includes a ring-shaped first sealing portion 31A provided between the first transparent conductive portions 12A to 12D and the counter electrode 20. Meanwhile, as illustrated in FIG. 4, the first sealing portions 31A adjacent to each other are integrated to constitute a first integrated sealing portion 31. In other words, the first integrated sealing portion 31 is constituted by a ring-shaped portion (hereinafter, referred to as an "ring-shaped portion") 31a which is not provided between the two counter electrodes 20 adjacent to each other and a portion (hereinafter, referred to as a "partitioning portion") 31b which is provided between the two counter electrodes 20 adjacent to each other and partitions an inner opening 31c of the ring-shaped portion 31a. However, the first sealing portions 31A adjacent to each other may not be integrated. Further, as illustrated in FIG. 1, the sealing portion 30A may have a ring-shaped second sealing portion 32A which is provided to overlap with the first sealing portion 31A and which sandwiches the edge portion 20a of the counter electrode 20 together with the first sealing portion 31A. Meanwhile, as illustrated in FIG. 5, the second sealing portions 32A are integrated between the counter electrodes 20 adjacent to each other to constitute a second integrated sealing portion 32. The second integrated sealing portion 32 is constituted by a ring-shaped portion (hereinafter, referred to as a "ring-shaped portion") 32a which is not provided between the two counter electrodes 20 adjacent to each other and a portion 32b which is provided between the two counter electrodes 20 adjacent to each other and partitions an inner opening 32c of the ring-shaped portion 32a. However, the second sealing portions 32A adjacent to each other may not be integrated.

In addition, as illustrated in FIG. 1 and FIG. 6, the photoelectric conversion element 100 includes an insulating layer 33 formed of an insulating material. The insulating layer 33 is provided between the first sealing portion 31A and the first transparent conductive portion 12A, 12B, 12C, or 12D and along the outline of the first sealing portion 31A. That is, the insulating layer 33 is provided to overlap with the sealing portion 30A between the sealing portion 30A and the transparent substrate 11, between the sealing portion 30A and the transparent substrate 11. On the other hand, the second groove 90B separating the first transparent conductive portions adjacent to each other to form the plurality of first transparent conductive portions 12A to 12D and the first transparent conductive portion 12E together with the first groove 90A is formed in the first transparent conductive layer 112X. Further, the insulating layer 33 also enters the second groove 90B. Here, the insulating layer 33 may cover only a part of a region of the first transparent conductive portions 12A to 12D excluding the interface between the first transparent conductive portions and the oxide semiconductor layer 13, on the inside of the ring-shaped first sealing portion 31A, or may cover the entire region. Meanwhile, in a case where the insulating layer 33 covers the entire region of the first transparent conductive portions 12A to 12D excluding the interface between the first transparent conductive portions and the oxide semiconductor layer 13, the insulating layer 33 is in contact with the oxide semiconductor layer 13.

Further, as illustrated in FIG. 2, an outer circumferential edge 33a of the insulating layer 33 is provided on the outside from the sealing portion 30A to surround the entire sealing portion 30A of the cells 50A to 50D, in the case of observing the photoelectric conversion element 100 from a direction orthogonal to the one surface 11a of the transparent substrate 11. Here, the insulating layer 33 is provided to cover and hide a portion of the first transparent conductive portions 12A to 12D, which protrudes to the outside of the sealing portion 30A, on the inside from the outer circumferential edge 33a of the insulating layer 33 and on the outside of the sealing portion 30A. Further, the insulating layer 33 enters the first groove 90A and covers a part of the second transparent conductive portion 12F, and the rest of the second transparent conductive layer 112Y constituted by the second transparent conductive portion 12F is exposed.

Further, as illustrated in FIG. 2, an end portion 90E of the first groove 90A reaches the outer circumferential edge 112a of the transparent conductive layer 112, and the insulating layer 33 also enters the end portion 90E of the first groove 90A.

In addition, as illustrated in FIG. 2, a current collecting wiring 17 having resistance lower than that of the first transparent conductive portion 12D may extend on the connecting portion 12g of the first transparent conductive portion 12D. In addition, a first external connecting terminal 18a for extracting a current from the cell 50 may be provided on the first current extracting portion 12f of the first transparent conductive portion 12D, and a second external connecting terminal 18b for extracting a current from the cell 50 may be provided on the second current extracting portion 12h of the first transparent conductive portion 12E (see FIG. 2).

As illustrated in FIG. 2, bypass diodes 70A to 70D are connected in parallel with the cells 50A to 50D, respectively. Specifically, the bypass diode 70A is fixed on the second integrated sealing portion 32 between the cell 50A and the cell 50B, the bypass diode 70B is fixed on the second integrated sealing portion 32 between the cell 50B and the cell 50C, and the bypass diode 70C is fixed on the second integrated sealing portion 32 between the cell 50C and the cell 50D. The bypass diode 70D is fixed on the sealing portion 30A of the cell 50D. In addition, a wiring material 60Q is connected to connect the bypass diodes 70A to 70D, and the wiring material 60Q is fixed to the metal substrate 21 of the counter electrode 20. Moreover, the bypass diode 70D is connected with the first transparent conductive portion 12D via the wiring material 60P.

In addition, the photoelectric conversion element 100 may further include a back sheet (not illustrated). In this case, the back sheet is provided such that the cells 50A to 50D are disposed between the back sheet and the transparent substrate 11. A circumferential edge portion of the back sheet, for example, may be fixed to a circumferential edge portion of the insulating layer 33. The back sheet includes a laminated body including a weather-resistance layer and a metal layer, and an adhesive portion which is provided on a side opposite to the metal layer with respect to the laminated body and adheres to the second transparent conductive portion 12F via the insulating layer 33.

According to this photoelectric conversion element 100, it is possible to have excellent durability while suppressing the electrostatic charge.

Meanwhile, the present inventors assume the reason that the electrostatic charge is suppressed by the photoelectric conversion element 100, as follows. That is, a part of the second transparent conductive portion 12F provided on the outside of the first transparent conductive portions 12A to 12D and the first transparent conductive portion 12E included in the cells 50A to 50D is covered with the insulating layer 33, and the rest of the second transparent conductive layer 112Y constituted by the second transparent conductive portion 12F is exposed. For this reason, there is no electrostatic charge in the rest of the second transparent conductive layer 112Y, and the electrostatic charge to the insulating layer 33 is suppressed. For this reason, the electrostatic charge to the photoelectric conversion element 100 is sufficiently suppressed. Thus, the present inventors assume that the electrostatic charge can be suppressed according to the photoelectric conversion element 100.

In addition, the present inventors assume the reason that it is possible to have excellent durability by the photoelectric conversion element 100, as follows. That is, the outer circumferential edge 33a of the insulating layer 33 is provided on the outside of the sealing portion 30A to surround the entire sealing portion 30A of the cells 50A to 50D, in a case of observing the photoelectric conversion element 100 from the direction orthogonal to the one surface 11a of the transparent substrate 11, and the insulating layer 33 is provided to cover and hide a portion of the first transparent conductive layer 112X, which protrudes to the outside of the sealing portion 30A, on the inside from the outer circumferential edge 33a of the insulating layer 33 and on the outside of the sealing portion 30A. For this reason, the infiltration of moisture on the inside from the outer circumferential edge 33a of the insulating layer 33 is sufficiently suppressed. In addition, at this time, the route of moisture from an interface between the second transparent conductive layer 112Y and the insulating layer 33 to the cells 50A to 50D is elongated by the insulating layer 33. Further, the insulating layer 33 enters the first groove 90A. For this reason, the infiltration of moisture into the cells 50A to 50D is sufficiently suppressed. Thus, the present inventors assume that it is possible to have excellent durability according to the photoelectric conversion element 100.

In addition, in the photoelectric conversion element 100, the end portion 90E of the first groove 90A reaches the outer circumferential edge 112a of the transparent conductive layer 112, and the insulating layer 33 also enters the portion 90E of the first groove 90A (see FIG. 2).

Thus, the insulating layer 33 also enters the end portion of the first groove 90A. For this reason, the infiltration of moisture into the cell 50 through the end portion of the first groove 90A can be sufficiently suppressed.

Further, in the photoelectric conversion element 100, the second groove 90B separating the first transparent conductive portions adjacent to each other to form the plurality of first transparent conductive portions 12A to 12D and the first transparent conductive portion 12E together with the first groove 90A is famed in the first transparent conductive layer 112X. In addition, the insulating layer 33 also enters the second groove 90B.

For this reason, the filtration of moisture into the cells 50A to 50D through the second groove 90B is sufficiently suppressed.

Next, the first external connecting terminal 18a, the second external connecting terminal 18b, the insulating layer 33, the transparent substrate 11, the first transparent conductive portions 12A to 12D, and 12E, the second transparent conductive portion 12F, the connecting terminal 16, the counter electrode 20, the oxide semiconductor layer 13, the dye, the sealing portion 30A, the electrolyte 40, wiring materials 60P and 60Q, the back sheet, and the desiccant 95 will be described in detail.

(First External Connecting Terminal)

The first external connecting terminal 18a contains a metal material. Examples of the metal material include silver, copper, indium, and the like. These can be used singly or in combination of two or more kinds thereof.

(Second External Connecting Terminal)

The second external connecting terminal 18b contains a metal material. As the metal material, the same material as the metal material contained in the first external connecting terminal 18a can be used.

(Insulating Layer)

The insulating layer 33 may be constituted by an insulating material, but it is preferable that the insulating layer is constituted by a material having a melting point higher than that of the material constituting the first sealing portion 30A. For this reason, examples of the insulating material described above include an inorganic insulating material such as a glass frit, a thermosetting resin such as a polyimide resin, and a thermoplastic resin. Among them, the inorganic insulating material such as the glass frit or the thermosetting resin is preferably used. In this case, even in a case where the sealing portion 30A has fluidity at a high temperature, the insulating layer 33 is difficult to be fluidized even at a high temperature, compared to a case of being constituted by the thermoplastic resin. For this reason, a contact between the first transparent conductive portion 12A, 12B, 12C, or 12D and the counter electrode 20 can be sufficiently suppressed, and a short circuit between the first transparent conductive portion 12A, 12B, 12C, or 12D and the counter electrode 20 can be sufficiently suppressed. Among them, the inorganic insulating material such as the glass frit is preferable. In this case, in the photoelectric conversion element 100, more excellent durability can be obtained, compared to a case where the insulating material is an organic insulating material. A thickness from the transparent substrate 11 of the insulating layer 33 is typically 10 µm to 30 µm, and is preferably 15 µm to 25 µm.

The insulating layer 33 may be or may not be colored, but it is preferable that the insulating layer 33 be colored. When the insulating layer 33 is colored, it is possible to bring the color of the insulating layer 33 close to the color of the oxide semiconductor layer 13, and thus, more excellent appearance can be realized. Here, "colored" indicates that L* of an L*a*b* color space of the insulating layer 33 is less than 35. Here, when a spectral reflectivity of 700 nm with respect to D65 standard light of CIE is set to x, 546.1 nm is set to y, and 435.8 nm is set to z, L* is defined by the following expression.

$$L^* = 116 \times (0.2126z + 0.7152y + 0.0722x)^{1/3} - 16$$

The color of the insulating layer 33 is not particularly limited, and various colors can be used according to a purpose. For example, the color of the insulating layer 33 may be a color in the same system as that of the oxide semiconductor layer 13 if characters or design is not displayed in the first transparent conductive portions 12A to 12D, and 12E and the second transparent conductive portion 12F. Here, the color in the same system as that of the oxide semiconductor layer 13 indicates a color in which each difference between L*, a*, and b* of an L*a*b* color space of the insulating layer 33 and L*, a*, and b* of an L*a*b* color space of the oxide semiconductor layer 13 is within 5.

The insulating layer 33 is preferably a light transmission preventing layer preventing light transmission. Here, the "light transmission preventing layer" indicates a layer in which average light transmittance in the visible light wavelength region is 50% or less. In addition, the visible light wavelength region indicates a wavelength region of 380 to 800 nm.

(Transparent Substrate)

The material constituting the transparent substrate 11 may be a transparent material, for example, and examples of such a transparent material include glass such as borosilicate glass, soda lime glass, glass which is made of soda lime and whose iron component is less than that of ordinary soda lime glass, and quartz glass, polyethylene terephthalate (PET), polyethylene naphthalate (PEN), polycarbonate (PC), and polyethersulfone (PES). The thickness of the transparent substrate 11 is appropriately determined depending on the size of the photoelectric conversion element 100 and is not particularly limited, but it may be set to the range of from 50 to 10000 µm, for example.

(First Transparent Conductive Portion)

Examples of the material constituting the first transparent conductive portions 12A to 12D and 12E include a conductive metal oxide such as indium-tin-oxide (ITO), tin oxide ($SnO_2$), and fluorine-doped-tin-oxide (FTO). The first transparent conductive portions 12A to 12D and 12E may be constituted by a single layer or a laminate consisting of a plurality of layers containing different conductive metal oxides. It is preferable that the first transparent conductive portions 12A to 12D and 12E contain FTO since the first transparent conductive portions exhibit high heat resistance and chemical resistance in a case in which the first transparent conductive portions 12A to 12D and 12E is constituted by a single layer. The thickness of the first transparent conductive portions 12A to 12D and 12E may be set to the range of from 0.01 to 2 µm, for example.

(Second Transparent Conductive Portion)

As the material constituting the second transparent conductive portion 12F, the same material as that constituting the first transparent conductive portions 12A to 12D and 12E can be used. The second transparent conductive portion 12F may be constituted by a single layer or a laminate consisting of a plurality of layers containing different conductive metal oxides. It is preferable that the second transparent conductive portion 12F contain FTO since the second transparent conductive portion exhibits high heat resistance and chemical resistance in a case in which the second transparent conductive portion 12F is constituted by a single layer. The thickness of the second transparent conductive portion 12F may be set to the range of from 0.01 to 2 µm, for example.

A width of the exposed region of the second transparent conductive portion 12F from the outer circumferential edge 112a (an exposure width) is not particularly limited if the width is greater than 0 mm, bur for example, is preferably 0.1 mm or more, is more preferably 0.3 mm or more, and is particularly preferably 0.5 mm or more, from the viewpoint of further improving the durability of the photoelectric conversion element 100, and of more sufficiently suppressing the electrostatic charge to the photoelectric conversion element 100. However, it is preferable that the exposure width be 1.0 mm or less, from the viewpoint of improving the durability of the photoelectric conversion element 100. Meanwhile, the exposure width indicates a width W1 in which the second transparent conductive portion 12F is exposed, in a portion 12Fa where a width W between the outer circumferential edge 112a of the second transparent conductive portion 12F and the first groove 90A is maximized. Here, the width W1 in which the second transparent conductive portion 12F is exposed, indicates a length in a direction orthogonal to the outer circumferential edge 112a of the second transparent conductive portion 12F.

Here, when the width in the portion 12Fa where the width W between the outer circumferential edge 112a of the second transparent conductive portion 12F and the first groove 90A is maximized is set to Wmax, W1/Wmax is not particularly limited if it is greater than 0 and less than 1, but is preferably 0.1 or more, is more preferably 0.3 or more, and is particularly preferably 0.5 or more, from the viewpoint of further improving the durability of the photoelectric conversion element 100, and of more sufficiently suppressing the electrostatic charge to the photoelectric conversion element 100. However, W1/Wmax is preferably 0.8 or less, and is more preferably 0.4 or less, from the viewpoint of improving the durability of the photoelectric conversion element 100.

(Connecting Terminal)

The connecting terminal 16 contains a metal material. Examples of the metal material include silver, copper, indium and the like. These may be used singly or in combination of two or more kinds thereof.

In addition, the metal material of the connecting terminal 16 may be constituted by the same material as or a different material from the wiring material 60P.

(Counter Electrode)

As described above, the counter electrode 20 comprises the metal substrate 21 and the catalyst layer 22.

The metal substrate 21 may be constituted by a metal, but it is preferable that the metal be a metal which is capable of forming a passive state. In this case, since the metal substrate 21 is difficult to be corroded by the electrolyte 40, the photoelectric conversion element 100 can have more excellent durability. Examples of the metal which is capable of forming the passive state include titanium, nickel, molybdenum, tungsten, aluminum, stainless steel, or an alloy thereof, and the like. The thickness of the metal substrate 21 is appropriately determined according to the size of the photoelectric conversion element 100, and is not particularly limited, but for example, may be 0.005 mm to 0.1 mm.

The catalyst layer 22 is constituted by platinum, a carbon-based material, a conductive polymer, or the like. Here, carbon black or a carbon nanotube is preferably used as the carbon-based material.

(Oxide Semiconductor Layer)

The oxide semiconductor layer 13 is constituted by oxide semiconductor particles. The oxide semiconductor particles are constituted by, for example, titanium oxide ($TiO_2$), silicon oxide ($SiO_2$), zinc oxide (ZnO), tungsten oxide ($WO_3$), niobium oxide ($Nb_2O_5$), strontium titanate ($SrTiO_3$), tin oxide ($SnO_2$) or two or more kinds of these.

The thickness of the oxide semiconductor layer 13 may be set to 0.1 µm to 100 µm, for example.

(Dye)

As the dye, for example, a photosensitizing dye such as a ruthenium complex having a ligand including a bipyridine structure, a terpyridine structure or the like, an organic dye including porphyrin, eosin, rhodamine, merocyanine or the like; or an organic-inorganic composite dye including a halogenated lead-based perovskite crystal are exemplified. As the halogenated lead-based perovskite, for example, $CH_3NH_3PbX_3$ (X=Cl, Br, I) is used. Among the above dyes, a ruthenium complex having a ligand including a bipyridine structure or a terpyridine structure is preferable. In this case, it is possible to further improve the photoelectric conversion characteristics of the photoelectric conversion element 100. Meanwhile, in a case where a photosensitizing dye is used as the dye, the photoelectric conversion element 100 becomes a dye-sensitized photoelectric conversion element.

(Sealing Portion)

The sealing portion 30A is constituted by the first sealing portion 31A and the second sealing portion 32A.

Examples of the material constituting the first sealing portion 31A include a resin such as a modified polyolefin resin including an ionomer, an ethylene-vinyl acetic anhydride copolymer, an ethylene-methacrylic acid copolymer, an ethylene-vinyl alcohol copolymer and the like, an ultraviolet-cured resin, and a vinyl alcohol polymer.

The thickness of the first sealing portion 31A is typically from 20 to 90 µm and preferably from 40 to 80 µm.

Examples of the material constituting the second sealing portion 32A include a resin such as a modified polyolefin resin including an ionomer, an ethylene-vinyl acetic anhydride copolymer, an ethylene-methacrylic acid copolymer, an ethylene-vinyl alcohol copolymer and the like, an ultraviolet-cured resin, and a vinyl alcohol polymer in the same manner as the first sealing portion 31A. The material constituting the second sealing portion 32A may be the same as or different from the material constituting the first sealing portion 31A.

The thickness of the second sealing portion 32A is typically from 20 to 45 µm and preferably from 30 to 40 µm.

(Electrolyte)

The electrolyte 40 contains, a redox couple and an organic solvent. It is possible to use acetonitrile, methoxy acetonitrile, methoxy propionitrile, propionitrile, ethylene carbonate, propylene carbonate, diethyl carbonate, γ-butyrolactone, valeronitrile, or pivalonitrile as the organic solvent. Examples of the redox couple include a redox couple such as a zinc complex, an iron complex, and a cobalt complex in addition to a redox couple containing a halogen atom such as iodide ion/polyiodide ion (for example, $I^-/I_3^-$), bromide ion/polybromide ion or the like.

In addition, the electrolyte 40 may use an ionic liquid instead of the organic solvent. As the ionic liquid, for example, an ordinary temperature molten salt which is a known iodine salt, such as a pyridinium salt, an imidazolium salt, or a triazolium salt, and which is in a molten state at around room temperature is used. As such an ordinary temperature molten salt, for example, 1-hexyl-3-methylimidazolium iodide, 1-ethyl-3-propylimidazolium iodide, 1-ethyl-3-methylimidazolium iodide, 1,2-dimethyl-3-propylimidazolium iodide, 1-butyl-3-methylimidazolium iodide, or 1-methyl-3-propylimidazolium iodide is preferably used.

In addition, the electrolyte 40 may use a mixture of the above ionic liquid and the above organic solvent instead of the above organic solvent.

In addition, it is possible to add an additive to the electrolyte 40. Examples of the additive include LiI, tetrabutylammonium iodide, 4-t-butylpyridine, guanidium thiocyanate, 1-methylbenzimidazole, and 1-butylbenzimidazole.

Moreover, as the electrolyte 40, a nanocomposite gel electrolyte which is a quasi-solid electrolyte obtained by kneading nanoparticles such as $SiO_2$, $TiO_2$, and carbon nanotubes with the above electrolyte to form a gel-like form may be used, or an electrolyte gelled using an organic gelling agent such as polyvinylidene fluoride, a polyethylene oxide derivative, and an amino acid derivative may also be used.

Meanwhile, the electrolyte 40 contains a redox couple including iodide ions/polyiodide ions (for example, $I^-/I_3^-$), and a concentration of the polyiodide ions (for example, $I_3^-$) is preferably 0.010 mol/L or less, more preferably 0.005 mol/L or less, and even more preferably in a range of $2 \times 10^{-4}$ mol/L or less. In this case, since the concentration of polyiodide ions carrying electrons is low, leakage current can be further reduced. For this reason, an open circuit voltage can be further increased, and thus the photoelectric conversion characteristics can be further improved.

(Wiring Material)

The wiring material 60P and the wiring material 60Q contain at least conductive particles and a binder resin. The conductive particles may be any particles as long as they have conductivity, but are typically metal particles. Silver or the like can be used as a metal constituting the metal particles.

A content rate of the conductive particles in the wiring material 60P and the wiring material 60Q is not particularly limited, but is preferably 50 mass % to 95 mass %, and is more preferably 60 mass % to 90 mass %.

The binder resin is not particularly limited, and examples of such a binder resin include a polyester resin, an epoxy resin, an acrylic resin, a cellulose resin, and the like. These may be used singly or in combination of two or more kinds thereof. Meanwhile, the wiring material 60P and the wiring material 60Q may not necessarily contain the binder resin.

<Back Sheet>

As described above, the back sheet includes the laminated body including the weather resistant layer and the metal layer and the adhesive portion which is provided on the surface of the cell 50 side of the laminated body and adheres the laminated body and the insulating layer 33.

The weather resistant layer may be constituted by, for example, polyethylene terephthalate or polybutylene terephthalate.

The thickness of the weather resistant layer may be from 50 to 300 μm, for example.

The metal layer may be constituted by, for example, a metal material containing aluminum. The metal material is typically constituted by aluminum simple substance but may be an alloy of aluminum and other metals. Examples of the other metals include, for example, copper, manganese, zinc, magnesium, lead, and bismuth.

Specifically, a 1000 series aluminum is desirable in which other metals are added to pure aluminum of 98% or higher purity in a trace quantity. This is because this 1000 series aluminum is inexpensive and excellent in workability compared to other aluminum alloys.

The thickness of the metal layer is not particularly limited but may be from 12 to 30 μm, for example.

The laminated body may further include a resin layer. Examples of the material constituting the resin layer include a butyl rubber, a nitrile rubber, and a thermoplastic resin. These can be used singly or in combination of two or more kinds thereof. The resin layer may be famed on the entire surface on the side opposite to the weather resistant layer of the metal layer or may be formed only on the peripheral portion thereof.

Examples of the material constituting the adhesive portion include a butyl rubber, a nitrile rubber, and a thermoplastic resin. These can be used singly or in combination of two or more kinds thereof. The thickness of the adhesive portion is not particularly limited but may be from 300 to 1000 μm, for example.

<Desiccant>

The desiccant 95 may be in a sheet shape or granular. The desiccant 95 may be one which absorbs moisture, for example, and examples of the desiccant 95 include silica gel, alumina, zeolite and the like.

Next, the method of manufacturing the photoelectric conversion element 100 will be described with reference to FIG. 3 and FIG. 6.

First, a laminate obtained by forming one continuous transparent conductive film on one transparent substrate 11 is prepared.

As the method of forming the transparent conductive film, a sputtering method, a vapor deposition method, a spray pyrolysis deposition method, or a CVD method is used.

Next, as illustrated in FIG. 3, the first groove 90A and the second groove 90B are formed in the transparent conductive film, and the transparent conductive layer 112 which has the first transparent conductive layer 112X constituted by the first transparent conductive portions 12A to 12D and 12E and the second transparent conductive layer 112Y constituted by the second transparent conductive portion 12F is famed. Specifically, the four first transparent conductive portions 12A to 12D corresponding to the cells 50A to 50D are formed so as to have the quadrangular-shaped main body portion 12a and the protruding portion 12c. At this time, the first transparent conductive portions 12A to 12C corresponding to the cells 50A to 50C are formed such that the protruding portion 12c has not only the projecting portion 12d but also the facing portion 12e which extends from the projecting portion 12d and faces the main body portion 12a of the adjacent cell 50. In addition, the first transparent conductive portion 12D is famed so as to have not only the quadrangular-shaped main body portion 12a and the projecting portion 12d but also the first current extracting portion 12f and the connecting portion 12g connecting the first current extracting portion 12f and the main body portion 12a. At this time, the first current extracting portion 12f is famed so as to be disposed on the side opposite to the first transparent conductive portion 12B with respect to the first transparent conductive portion 12A. Moreover, the first transparent conductive portion 12E is formed so as to have the second current extracting portion 12h. At this time, the second current extracting portion 12h is famed so as to be disposed on the side opposite to the first transparent conductive portion 12B with respect to the first transparent conductive portion 12A and to be disposed next to the first current extracting portion 12f via the second groove 90B.

It is possible to form the first groove 90A and the second groove 90B by, for example, a laser scribing method using a YAG laser, a $CO_2$ laser or the like as the light source.

Next, precursors of the connecting terminals 16 are famed on the protruding portions 12c of the first transparent conductive portions 12A to 12C. In addition, the precursor of the connecting terminal 16 is also famed on the first transparent conductive portion 12E. The precursor of the connecting terminal 16 can be formed, for example, by coating and drying a silver paste.

Moreover, a precursor of the current collecting wiring 17 is famed on the connecting portion 12g of the first transparent conductive portion 12D. The precursor of the current collecting wiring 17 can be famed, for example, by coating and drying a silver paste.

In addition, a precursor of the first external connecting terminal 18a and a precursor of the second external connecting terminal 18b for extracting the current to the outside are respectively famed on the first current extracting portion 12f and the second current extracting portion 12h of the first transparent conductive portion 12E. The precursor of the first external connecting terminal 18a and the precursor of the second external connecting terminal 18b can be famed, for example, by coating and drying a silver paste.

Further, a precursor of the insulating layer 33 is formed in a region to which the sealing portion 30A is scheduled to adhere (hereinafter, referred to as a "sealing portion adhesion scheduled region"), and a region surrounding the entire region (hereinafter, referred to as a "surrounding region"). At this time, since the first groove 90A or the second groove 90B is famed in the sealing portion adhesion scheduled region, the precursor of the insulating layer 33 is famed to fill the second groove 90B and cover an edge portion of the main body portion 12a. In addition, the precursor of the insulating layer 33 is formed in the surrounding region to cover and hide a portion of the first transparent conductive layer 112X, which protrudes to the outside of the sealing portion 30A, on the inside from the outer circumferential edge and the outside of the sealing portion adhesion scheduled region. At this time, the precursor of the insulating layer 33 is not famed in a region where a precursor of the connecting terminal 16 is famed. In addition, the precursor of the insulating layer 33 is famed to enter the first groove 90A, cover a part of the second transparent conductive layer 112Y, and expose the rest of the second transparent conductive layer 112Y. The insulating layer 33, for example, can be formed by coating and drying a paste containing an insulating material.

Next, the precursor of the connecting terminal 16, the precursor of the current collecting wiring 17, the precursors of the first external connecting terminal 18a and the second external connecting terminal 18b and the precursor of the insulating material 33 are collectively fired to form the connecting terminal 16, the current collecting wiring 17, the first external connecting terminal 18a, the second external connecting terminal 18b and the insulating material 33.

At this time, the firing temperature varies depending on the kind of a glass frit but is typically from 350 to 600° C., and the firing time also varies depending on the kind of a glass frit but is typically from 1 to 5 hours.

Next, a precursor of the oxide semiconductor layer 13 is famed on the main body portion 12a of each of the first transparent conductive portions 12A to 12D.

The precursor of the oxide semiconductor layer 13 can be obtained by printing and then drying a paste for oxide semiconductor layer for forming the oxide semiconductor layer 13. The paste for oxide semiconductor layer contains a resin such as polyethylene glycol, ethyl cellulose or the like and a solvent such as terpineol in addition to the titanium oxide.

It is possible to use, for example, a screen printing method, a doctor blading method, or a bar coating method as the printing method of the paste for oxide semiconductor layer.

Next, the precursor of the oxide semiconductor layer 13 is fired to form the oxide semiconductor layer 13.

At this time, the firing temperature varies depending on the kind of the oxide semiconductor particles but is typically from 350 to 600° C., and the firing time also varies depending on the kind of the oxide semiconductor particles but is typically from 1 to 5 hours. Thus, a working electrode is obtained (see FIG. 6).

Next, a first integrated sealing portion forming body for forming the first integrated sealing portion is prepared. The first integrated sealing portion forming body can be obtained by preparing one sheet of resin film for sealing composed of the material constituting the first integrated sealing portion and forming quadrangular-shaped openings in the resin film for sealing as many as the number of the cells 50. The first integrated sealing portion forming body has a structure obtained by integrating a plurality of first sealing portion forming bodies.

Then, the first integrated sealing portion forming body is adhered onto the sealing portion adhesion scheduled region. At this time, since a part of the insulating layer 33 is provided in advance in the sealing portion adhesion scheduled region, the first integrated sealing portion forming body is adhered to the insulating layer to overlap with the insulating layer 33. The adhesion of the first integrated sealing portion forming body to the conductive substrate 15 can be performed by heating and melting the first integrated sealing portion forming body. In addition, the first integrated sealing portion forming body is adhered to the conductive substrate 15 such that the main body portion 12a of the first transparent conductive portions 12A to 12D is disposed on the inside of the first integrated sealing portion forming body.

Next, the dye is supported on the oxide semiconductor layer 13 of the working electrode to which the first integrated sealing portion forming body is adhered. For this, the dye may be adsorbed on the oxide semiconductor layer 13 by immersing the working electrode in a solution containing the dye, then washing out the extra dye with the solvent component of the above solution after making the dye adsorb on the oxide semiconductor layer 13, and performing drying.

Next, the electrolyte 40 is disposed on the oxide semiconductor layer 13.

On the other hand, the counter electrodes 20 are prepared to have the same number as the number of the cells 50.

The counter electrodes 20 can be obtained by forming the catalyst layer 22 on the metal substrate 21.

Next, one more piece of the first integrated sealing portion forming body described above is prepared. Thereafter, each of the plurality of the counter electrodes 20 is bonded so as to close each of the openings of the first integrated sealing portion forming body.

Subsequently, the first integrated sealing portion forming body adhered to the counter electrode 20 and the first integrated sealing portion forming body adhered to the working electrode are superposed, and heated and melted while the first integrated sealing portion forming bodies are pressed. In this way, the first integrated sealing portion is formed between the working electrode and the counter electrode 20. Formation of the first integrated sealing portion may be performed under the atmospheric pressure or under reduced pressure. However, the first integrated sealing portion is preferably famed under reduced pressure.

Next, the second integrated sealing portion 32 is prepared. The second integrated sealing portion 32 has a structure obtained by integrating a plurality of the second sealing portions 32A. The second integrated sealing portion 32 can be obtained by preparing one sheet of resin film for sealing and forming a quadrangular-shaped opening in the resin film for sealing as many as the number of the cells 50. The second integrated sealing portion 32 is bonded to the counter electrode 20 so as to sandwich the edge portion 20a of the counter electrode 20 together with the first integrated sealing portion. The adhesion of the second integrated sealing portion 32 to the counter electrode 20 can be performed by heating and melting the second integrated sealing portion 32.

Examples of the resin film for sealing include a resin such as a modified polyolefin resin including an ionomer, an ethylene-vinyl acetate anhydride copolymer, an ethylene methacrylic acid copolymer, an ethylene-vinyl alcohol copolymer, or the like, an ultraviolet-cured resin, and a vinyl alcohol polymer.

Next, the bypass diodes 70A to 70D are fixed to the second integrated sealing portion 32.

Then, the wiring materials 60Q are connected to connect the bypass diodes 70A to 70D. At this time, the wiring materials 60Q are fixed onto the metal substrate 21 of each of the cells 50A to 50D. The wiring materials 60Q can be obtained by preparing a paste containing the material constituting the wiring materials 60Q, coating the paste onto the metal substrate 21 of the counter electrode 20, and curing the paste.

Next, the wiring material 60P is famed to connect the wiring material 60Q fixed onto the metal substrate 21 of the cell 50A and the connecting terminal 16 on the first transparent conductive portion 12E. Specifically, the wiring material 60P is famed by preparing a paste containing the material constituting the wiring material 60P, coating the paste to connect the wiring material 60Q and the connecting terminal 16 on the first transparent conductive portion 12E, and curing the paste.

Similarly, the wiring material 60P is famed to connect the wiring material 60Q fixed on the metal substrate 21 of the cell 50B and the connecting terminal 16 on the first transparent conductive portion 12A, the wiring material 60P is famed to connect the wiring material 60Q fixed on the metal substrate 21 of the cell 50C and the connecting terminal 16 on the first transparent conductive portion 12B, and the wiring material 60P is famed to connect the wiring material 60Q fixed on the metal substrate 21 of the cell 50D and the connecting terminal 16 on the first transparent conductive portion 12C. Further, the wiring material 60P is formed to connect the bypass diode 70D and the first transparent conductive portion 12D.

Next, the back sheet is prepared, and the peripheral portion of the back sheet is adhered to the insulating layer 33 in a case where the photoelectric conversion element 100 has the back sheet.

Thus, the photoelectric conversion element 100 is obtained in the manner described above.

Meanwhile, in the description mentioned above, a method to collectively fire the precursor of the connecting terminal 16, the precursor of the current collecting wiring 17, the precursor of the first external connecting terminal 18a, the precursor of the second external connecting terminal 18b and the precursor of the insulating material is used in order to form the connecting terminal 16, the current collecting wiring 17, the first external connecting terminal 18a, the second external connecting terminal 18b and the insulating material 33, but the connecting terminal 16, the current collecting wiring 17, the first external connecting terminal 18a, the second external connecting terminal 18b and the insulating material 33 may be formed by separately firing each of the precursors.

The present invention is not limited to the embodiment described above. For example, in the above embodiment, the second groove 90B separating the first transparent conductive portions 12A to 12E together with the first groove 90A is famed to form the first transparent conductive portions 12A to 12E in the first transparent conductive layer 112X, and the insulating layer 33 also enters the second groove 90B, but it is not always necessary that the insulating layer 33 enters the second groove 90B.

Further, in the above embodiment, the first sealing portion 31A is provided between the counter electrode 20 and the first transparent conductive portions 12A to 12D, but the first sealing portion 31A may be provided between the counter electrode 20 and the transparent substrate 11, and the first sealing portion may not be necessarily provided between the counter electrode 20 and the first transparent conductive portions 12A to 12D.

In addition, in the above embodiment, the counter electrode 20 includes the metal substrate 21 and the catalyst layer 22, but a transparent conductive substrate may be used instead of the metal substrate 21 if the photoelectric conversion element 100 does not include the back sheet. In this case, the transparent substrate 11 or the transparent conductive layer 112 of the conductive substrate 15 may not be necessarily transparent. For example, an opaque substrate or an opaque conductive layer may be used instead of the transparent substrate 11 or the transparent conductive layer 112 of the conductive substrate 15.

In addition, in the above embodiments, the oxide semiconductor layer 13 is provided on the conductive substrate 15, but the oxide semiconductor layer 13 may be provided on the metal substrate 21 of the counter electrode 20, which is the second substrate. However, in this case, the catalyst layer 22 is provided on the conductive substrate 15.

Further, in the above embodiments, an outside region of the first current extracting portion 12f of the first transparent conductive portion 12D is exposed, but the outside region of the first current extracting portion 12f may be covered with the insulating layer 33 except for a region where the first external connecting terminal 18a is formed. That is, it is preferable that the entire portion of the first transparent conductive layer 112X, which protrudes to the outside of the sealing portion 30A, is covered and hidden with the insulating layer 33, on the outside of the sealing portion 30A. In this case, it is possible to further improve the photoelectric conversion characteristics of the photoelectric conversion element 100.

In addition, in the above embodiment, in a case where the photoelectric conversion element 100 includes the back sheet, the back sheet and the transparent conductive layer 112 adhere to each other via the insulating layer 33, but it is not always necessary that the back sheet and the transparent conductive layer 112 adhere to each other via the insulating layer 33.

Moreover, in the above embodiment, the plurality of cells 50 are connected in series by the wiring materials 60P, but may be connected in parallel.

Figure 7:
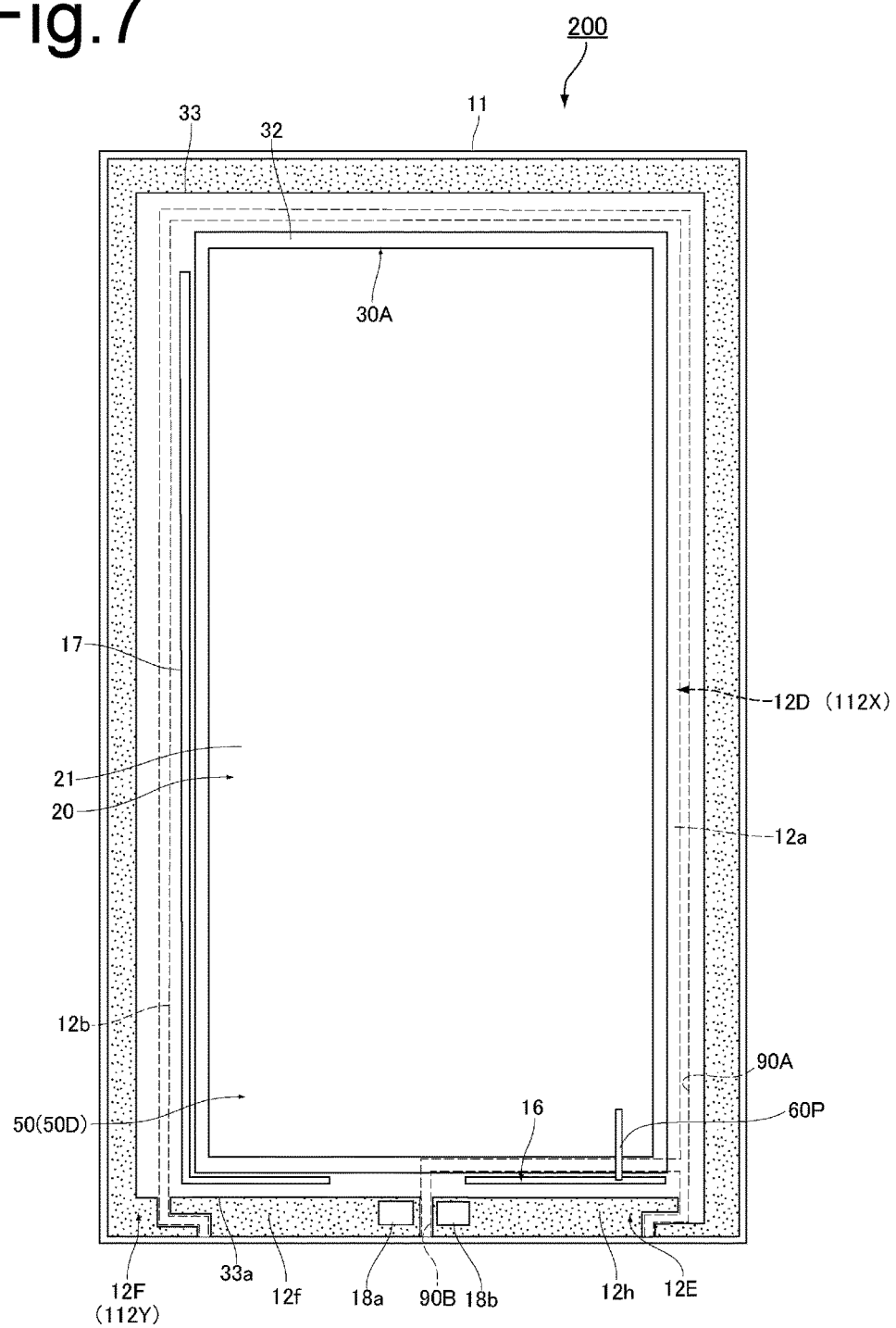
FIG. 7 is a plan view illustrating a second embodiment of the photoelectric conversion element of the invention.

Further, in the above embodiment, the plurality of cells 50 are used, but as with a photoelectric conversion element 200 illustrated in FIG. 7, the photoelectric conversion element of the present invention may include only one cell 50D. In this case, the first transparent conductive layer 112X is constituted by only one first transparent conductive portion 12D.

Figure 8:
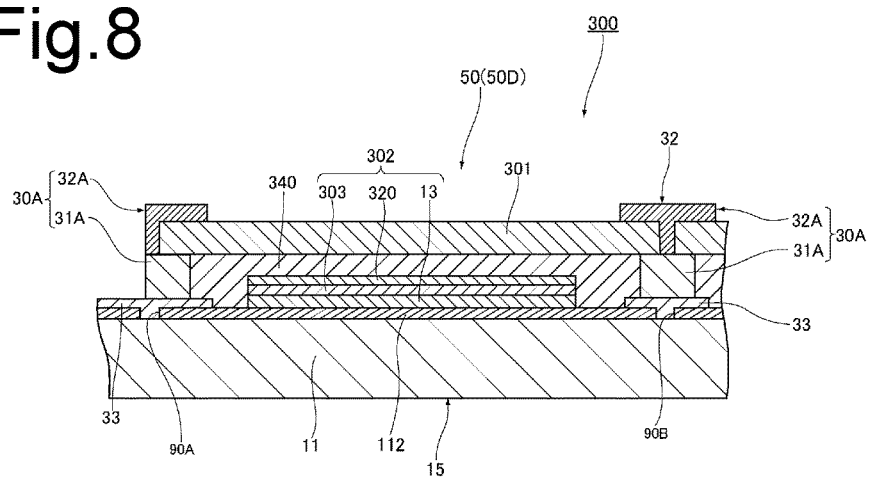
FIG. 8 is an end view of the cut section illustrating a part of a third embodiment of the photoelectric conversion element of the invention.

In addition, in the above-described embodiment, as with a photoelectric conversion element 300 illustrated in FIG. 8, an insulating substrate 301 may be used instead of the counter electrode 20 as the second substrate. In this case, a structure 302 is disposed in a space between the insulating substrate 301, the sealing portion 30A and the conductive substrate 15. The structure 302 is provided on the surface of the side facing the insulating substrate 301 of the conductive substrate 15. The structure 302 is constituted by the oxide semiconductor layer 13, the porous insulating layer 303, and the counter electrode 320 in order from the conductive substrate 15. In addition, an electrolyte 340 is disposed in the above space. The electrolyte 340 is impregnated even into the inside of the oxide semiconductor layer 13 and the porous insulating layer 303. As the electrolyte 340, the same one as the electrolyte 40 can be used. Herein, it is possible to use, for example, a glass substrate or a resin film as the insulating substrate 301. In addition, it is possible to use the same one as the counter electrode 20 as the counter electrode 320. Alternatively, the counter electrode 320 may be constituted by, for example, a porous single layer containing carbon or the like. The porous insulating layer 303 is mainly provided in order to prevent the physical contact of the oxide semiconductor layer 13 and the counter electrode 320 and to impregnate the electrolyte 340 thereinto. It is possible to use, for example, a fired body of an oxide as the porous insulating layer 303. Meanwhile, although in the photoelectric conversion element 300 illustrated in FIG. 8, only one of the structure 302 is provided in the space between the sealing portion 30A, the conductive substrate 15 and the insulating substrate 301, the plurality of the structures 302 may be provided. In addition, the porous insulating layer 303 is provided between the oxide semiconductor layer 13 and the counter electrode 320. However, the porous insulating layer may be provided between the conductive substrate 15 and the counter electrode 320 so as to surround the oxide semiconductor layer 13 without providing the porous insulating layer between the oxide semiconductor layer 13 and the counter electrode 320. With this structure as well, physical contact of the oxide semiconductor layer 13 and the counter electrode 320 can be prevented.

EXAMPLES

Hereinafter, the content of the present invention will be described more specifically with reference to Examples, but the present invention is not limited to the following Examples.

Example 1

First, a laminate obtained by forming a transparent conductive film composed of FTO having a thickness of 1 μm on a transparent substrate which is composed of glass and has a thickness of 1 mm was prepared. Next, as illustrated in FIG. 3, the first groove 90A and the second groove 90B were famed on one continuous transparent conductive film by a $CO_2$ laser (V-460 manufactured by Universal Laser Systems Inc.), and the first transparent conductive portions 12A to 12D, 12E and the second transparent conductive portion 12F were famed. At this time, the width of the first groove 90A and the second groove 90B was set to 1 mm. In addition, each of the first transparent conductive portions 12A to 12C was famed so as to have the main body portion having a quadrangular shape of 4.6 cm×2.0 cm and the protruding portion protruding from the side edge portion of one side of the main body portion. In addition, the first transparent conductive portion 12D was formed so as to have the main body portion having a quadrangular shape of 4.6 cm×2.1 cm and the protruding portion protruding from the side edge portion of one side of the main body portion. In addition, the protruding portion 12c of the three first transparent conductive portions 12A to 12C among the first transparent conductive portions 12A to 12D was constituted by the projecting portion 12d projecting from the one side edge portion 12b of the main body portion 12a and the facing portion 12e which is extended from the projecting portion 12d and faces the main body portion 12a of the adjacent transparent conductive layer.

In addition, the protruding portion 12c of the first transparent conductive portion 12D was constituted only by the projecting portion 12d projecting from the side edge portion 12b of the main body portion 12a. At this time, the length of the projecting direction (the direction orthogonal to the X direction in FIG. 2) of the projecting portion 12d was set to 2.1 mm and the width of the projecting portion 12d was set to 9.8 mm. In addition, the width of the facing portion 12e was set to 2.1 mm and the length of the facing portion 12e in the extending direction was set to 9.8 mm. In addition, the first transparent conductive portion 12D was famed so as to have the first current extracting portion 12f and the connecting portion 12g connecting the first current extracting portion 12f and the main body portion 12a. The first transparent conductive portion 12E was famed so as to have the second current extracting portion 12h. At this time, the width of the connecting portion 12g was set to 1.3 mm and the length thereof was set to 59 mm. In addition, when the resistance value of the connecting portion 12g was measured by the four probe method, it was 100Ω.

Further, the second transparent conductive portion 12F was famed to surround the first transparent conductive portions 12A to 12D, and 12E via the first groove 90A. At this time, the second transparent conductive portion 12F was famed such that a width Wmax of the portion 12Fa where the width W between the outer circumferential edge of the second transparent conductive portion 12F and the first groove 90A was maximized was 1 mm.

Next, a precursor of the connecting terminal 16 constituted by the wiring material connecting portion and the wiring material non-connecting portion was formed on the protruding portion 12c of the first transparent conductive portions 12A to 12C. Specifically, the precursor of the connecting terminal 16 was famed such that a precursor of the wiring material connecting portion was provided on the facing portion 12e and a precursor of the wiring material non-connecting portion was provided on the projecting portion 12d. At this time, the precursor of the wiring material non-connecting portion was formed so as to be narrower than the width of the wiring material connecting portion.

The precursor of the connecting terminal 16 was famed by coating a silver paste by screen printing and drying it.

Furthermore, a precursor of the current collecting wiring 17 was formed on the connecting portion 12g of the first transparent conductive portion 12D. The precursor of the current collecting wiring 17 was formed by coating a silver paste by screen printing and drying it.

In addition, a precursor of the first external connecting terminal 18a and a precursor of the second external connecting terminal 18b for extracting the current to the outside were formed on the first current extracting portion 12f and the second current extracting portion 12h of the first transparent conductive portion 12E, respectively. The precursors of the first external connecting terminal 18a and the second external connecting terminal 18b were famed by coating a silver paste by screen printing and drying it.

Further, the precursor of the insulating layer 33 was famed in the sealing portion adhesion scheduled region and the surrounding region thereof. At this time, the precursor of the insulating layer 33 was formed to fill the first groove 90A and the second groove 90B and to cover the edge portion of the main body portion 12a. In addition, the precursor of the insulating layer 33 was formed in the surrounding region to cover and hide the portion of the first transparent conductive layer 112X, which protruded to the outside of the sealing portion adhesion scheduled region, on the inside from the outer circumferential edge and on the outside of the sealing portion adhesion scheduled region. At this time, the precursor of the insulating layer 33 was not famed in the region where the precursor of the connecting terminal 16 and the precursor of the current collecting wiring 17 were formed. In addition, the precursor of the insulating layer 33 was formed to enter the first groove 90A, cover a part of the second transparent conductive layer 112Y, and expose the rest of the second transparent conductive layer 112Y. Specifically, in the second transparent conductive layer 112Y, a region of 0.1 mm from the outer circumferential edge 112a of the transparent conductive layer 112 was exposed. That is, in the portion 12Fa where the width W between the outer circumferential edge of the second transparent conductive portion 12F and the first groove 90A was maximized, the rest of the second transparent conductive layer 112Y was exposed such that the width W1 between the outer circumferential edge of the second transparent conductive portion 12F and the outer circumferential edge of the precursor of the insulating layer 33 was 0.1 mm. The insulating material 33 was formed by coating and drying a paste containing a glass frit according to screen printing. At this time, the width of the edge portion of the first transparent conductive portion covered with the insulating material 33 was 0.2 mm from the groove.

Next, the precursor of the connecting terminal 16, the precursor of the current collecting wiring 17, the precursor of the first external connecting terminal 18a, the precursor of the second external connecting terminal 18b, and the precursor of the insulating material 33 were fired at 500° C. for 15 minutes, and the connecting terminal 16, the current collecting wiring 17, the first external connecting terminal 18a, the second external connecting terminal 18b, and the insulating material 33 were formed.

Next, a precursor of the oxide semiconductor layer 13 was famed on the main body portion 12a of each of the first transparent conductive portions 12A to 12D. At this time, the precursor of the oxide semiconductor layer 13 was obtained by coating a titanium oxide nanoparticle paste for forming a light absorption layer, which contained anatase crystal-type titanium oxide (PST-21NR, manufactured by JGC Catalysts and Chemicals Ltd.) into the shape of a square according to screen printing, and drying the paste at 150° C. for 10 minutes.

Next, the precursor of the oxide semiconductor layer 13 were fired at 500° C. for 15 minutes to form the oxide semiconductor layer 13. Thus, a working electrode having the conductive substrate 15 was obtained. At this time, the width of the wiring material connecting portion of the connecting terminal 16 was 1.0 mm and the width of the wiring material non-connecting portion thereof was 0.3 mm. In addition, the length along the extending direction of the wiring material connecting portion was 7.0 mm and the length along the extending direction of the wiring material non-connecting portion was 7.0 mm. In addition, the dimensions of the current collecting wiring 17, the first external connecting terminal 18a, the second external connecting terminal 18b and the oxide semiconductor layer 13 were as follows, respectively.

Current collecting wiring 17: 4 μm in thickness, 200 μm in width, 79 mm in length along the X direction in FIG. 2, and 21 mm in length along the direction orthogonal to the X direction in FIG. 2, First external connecting terminal 18a and second external connecting terminal 18b: 20 μm in thickness, 2 mm in width, and 7 mm in length, and Oxide semiconductor layer 13: 14 μm in thickness, 17 mm in length in the X direction in FIG. 2, and 42.1 mm in length in the direction orthogonal to the X direction in FIG. 2

Next, the first integrated sealing portion forming body for forming the first sealing portion was prepared. The first integrated sealing portion forming body was obtained by preparing one sheet of resin film for sealing which had 8.0 cm×4.6 cm×50 μm and was composed of a maleic anhydride modified polyethylene (trade name: Bynel, manufactured by Du Pont) and forming four quadrangular-shaped openings in the resin film for sealing. At this time, the first integrated sealing portion forming body was fabricated such that each opening had a size of 1.7 cm×4.4 cm×50 μm, the width of the ring-shaped portion surrounding all of the openings was 2 mm, and the width of the partitioning portion to partition the inner side opening of the ring-shaped portion was 2.6 mm.

Thereafter, the first integrated sealing portion forming body was superimposed on the insulating material 33 on the working electrode and then the first integrated sealing portion forming body was adhered to the insulating material 33 on the working electrode by heating and melting the first integrated sealing portion forming body.

Next, the working electrode to which the first integrated sealing portion forming body was adhered as described above was immersed for a whole day and night in a dye solution containing 0.2 mM of a photosensitizing dye consisting of N719 and a mixed solvent obtained by mixing acetonitrile and tert-butanol at a volume ratio of 1:1 as the solvent, and then taken out therefrom and dried, and thus the photosensitizing dye was supported on the oxide semiconductor layer.

Next, an electrolyte obtained by adding $I_2$, methyl benzoimidazole, butyl benzoimidazole, guanidium thiocyanate, and t-butyl pyridine to a mixture of dimethyl propyl imidazolium iodide and 3-methoxy propionitrile was dropped onto the oxide semiconductor layer, and thus, the electrolyte was disposed.

Next, four sheets of the counter electrodes were prepared. Two counter electrodes of the four sheets of the counter electrodes were prepared by forming the catalyst layer which had a thickness of 5 nm and was composed of platinum on the titanium foil of 4.6 cm×1.9 cm×40 µm by the sputtering method. The rest two counter electrodes of the four sheets of the counter electrodes were prepared by forming the catalyst layer which had a thickness of 5 nm and was composed of platinum on the titanium foil of 4.6 cm×2.0 cm×40 µm by the sputtering method. In addition, another first integrated sealing portion forming body was prepared and this first integrated sealing portion forming body was adhered to the surface facing the working electrode of the counter electrode in the same manner as described above.

Thereafter, the first integrated sealing portion forming body adhered to the working electrode and the first integrated sealing portion forming body adhered to the counter electrode were faced to each other, and thus the first integrated sealing portion forming bodies were superimposed on each other. Then, the first integrated sealing portion forming bodies were then heated and melted while applying a pressure to the first integrated sealing portion forming bodies in this state. Thus, the first sealing portion was famed between the working electrode and the counter electrode.

Next, the second integrated sealing portion was prepared. The second integrated sealing portion was obtained by preparing one sheet of resin film for sealing which had 8.0 cm×4.6 cm×50 µm and was composed of maleic anhydride modified polyethylene (trade name: Bynel, manufactured by Du Pont) and forming four quadrangular-shaped openings in the resin film for sealing. At this time, the second integrated sealing portion was fabricated such that each opening had a size of 1.7 cm×4.4 cm×50 µm, the width of the ring-shaped portion surrounding all of the openings was 2 mm, and the width of the partitioning portion partitioning the inner opening of the ring-shaped portion was 2.6 mm. The second integrated sealing portion was bonded to the counter electrode so as to sandwich the edge portion of the counter electrode together with the first integrated sealing portion. At this time, the second integrated sealing portion was bonded to the counter electrode and the first integrated sealing portion by heating and melting the first integrated sealing portion and the second integrated sealing portion while pressing the second integrated sealing portion to the counter electrode.

Next, the desiccant sheet was bonded on the metal substrate of each counter electrode with a double-sided tape. The dimensions of the desiccant sheet were 1 mm in thickness×3 cm in length×1 cm in width, and Zeosheet (trade name, manufactured by Shinagawa Chemicals Co., Ltd.) was used as the desiccant sheet.

Next, a silver paste was coated to connect the wiring material connecting portion on four first transparent conductive portions 12A to 12C and the first transparent conductive portion 12E, and the metal substrate 21 of each of the cells 50A to 50D, and was cured, and thus, the wiring material 60P having a width of 2 mm was famed. At this time, the wiring material 60P was formed by curing the silver paste at 85° C. for 12 hours.

Then, as illustrated in FIG. 2, the bypass diodes 70A to 70D were disposed on the second integrated sealing portion, and the wiring material 60Q having a width of 2 mm was famed to connect each of the bypass diodes 70A to 70D and the metal substrate 21 of the counter electrode 20 of each of the cells 50A to 50D. The wiring material 60Q was formed by coating the silver paste and by curing the silver paste at 85° C. for 12 hours according to a heat treatment. At this time, RB751V-40, manufactured by ROHM Co., Ltd., was used as the bypass diode.

Thus, a module was obtained.

Example 2

A module was fabricated in the same manner as that in Example 1, except that a part of the second transparent conductive layer 112Y was covered with the precursor of the insulating layer 33, the rest of the second transparent conductive layer 112Y was exposed, and a region of 0.3 mm from the outer circumferential edge 112a of the transparent conductive layer 112 of the second transparent conductive layer 112Y was exposed (that is, the rest of the second transparent conductive layer 112Y was exposed such that the width W1 between the outer circumferential edge of the second transparent conductive portion 12F and the outer circumferential edge of the precursor of the insulating layer 33 was 0.3 mm, in the portion 12Fa where the width W between the outer circumferential edge of the second transparent conductive portion 12F and the first groove 90A was maximized) at the time of forming the precursor of the insulating layer 33.

Example 3

A module was fabricated in the same manner as that in Example 1, except that a part of the second transparent conductive layer 112Y was covered with the precursor of the insulating layer 33, the rest of the second transparent conductive layer 112Y was exposed, and a region of 0.5 mm from the outer circumferential edge 112a of the transparent conductive layer 112 of the second transparent conductive layer 112Y was exposed (that is, the rest of the second transparent conductive layer 112Y was exposed such that the width W1 between the outer circumferential edge of the second transparent conductive portion 12F and the outer circumferential edge of the precursor of the insulating layer 33 was 0.5 mm, in the portion 12Fa where the width W between the outer circumferential edge of the second transparent conductive portion 12F and the first groove 90A was maximized) at the time of forming the precursor of the insulating layer 33.

Comparative Example 1

A module was fabricated in the same manner as that in Example 1, except that the entire second transparent conductive layer 112Y was covered with the precursor of the insulating layer 33 at the time of forming the precursor of the insulating layer 33.

Comparative Example 2

A module was fabricated in the same manner as that in Example 1, except that in the second transparent conductive layer 112Y, a region of 1.0 mm from the outer circumferential edge 112a of the transparent conductive layer 112 was exposed (that is, the rest of the second transparent conductive layer 112Y was exposed such that the width W1 between the outer circumferential edge of the second transparent conductive portion 12F and the outer circumferential edge of the precursor of the insulating layer 33 was 1.0 mm, in the portion 12Fa where the width W between the outer circumferential edge of the second transparent conductive portion 12F and the first groove 90A was maximized), and thus, the entire second transparent conductive layer 112Y was not covered but the entire second transparent conductive layer 112Y was exposed at the time of forming the precursor of the insulating layer 33.

[Characteristics Evaluation]

In the modules of Examples 1 to 3 and Comparative Examples 1 to 2, obtained as described above, the durability and the electrostatic charge characteristics were evaluated.

(Durability)

With respect to the modules obtained in Examples 1 to 3 and Comparative Examples 1 and 2, output ($\eta_0$) was measured. Subsequently, with respect to the modules obtained in Examples 1 and 2 and Comparative Examples 1 and 2, the output ($\eta$) after a heat cycle test based on JIS C 8938 was performed was also measured. Then, a retention rate of the output (an output retention rate) was calculated on the basis of the following expression:

Retention Rate of Photoelectric Conversion Efficiency (%)=$\eta/\eta_0 \times 100$ The results are shown in Table 1.

Meanwhile, in Table 1, an acceptance criterion of the durability was as follows.

(Acceptance Criterion) The photoelectric conversion maintenance rate is greater than or equal to 70%

(Electrostatic Charge Characteristics)

With respect to the modules obtained in Examples 1 to 3 and Comparative Examples 1 and 2, electrostatic charge diffusivity was measured by using an electrostatic diffusion rate measurement device NS-D100 (manufactured by Nano Seeds Corporation), on the basis of a test method defined in JISC61340-2-1. Subsequently, an initial surface potential was calculated from a surface potential attenuation curve obtained at this time.

Specifically, the initial surface potential was calculated according to the following procedures (1) to (3).

(1) First, each module obtained in Examples 1 to 3 and Comparative Examples 1 and 2 was placed on a sample stage, and electrostatic charge was performed by corona discharge. After that, a measurement sensor was slid to an upper position of the module in a state where the module was fixed, and measurement of a surface potential was started.

(2) Then, a signal from the sensor was recorded by using a dedicated application, and a surface potential attenuation curve represented by the following expression was obtained.

$$V = V_0 \exp(-\alpha vt)$$

(In the expression described above, V represents a surface potential, $V_0$ represents an initial surface potential, $\alpha$ represents attenuation speed, and t represents attenuation time)

(3) The initial surface potential was calculated from the expression described above. The initial surface potential was set to an index of the electrostatic charge characteristics. The results are shown in Table 1. Meanwhile, in Table 1, the initial surface potential represents a relative value at the time of setting the initial surface potential of Comparative Example 1 to 100. In addition, an acceptance criterion of the electrostatic charge characteristics is as follows.

(Acceptance Criterion) The initial surface potential is 80 or less and the electrostatic charge characteristics. In contrast, the modules of Comparative Examples 1 and 2 did not satisfy the acceptance criterion, in any one of the durability and the electrostatic charge characteristics.

From the results as described above, it was confirmed that according to the photoelectric conversion element of the invention, it has excellent durability while suppressing the electrostatic charge.

EXPLANATIONS OF LETTERS OR NUMERALS 11 transparent substrate (substrate)
11a one surface of transparent substrate
12A, 12B, 12C, 12D, 12E first transparent conductive portion (first conductive portion)
12F second transparent conductive portion (second conductive portion)
12Fa portion where width between outer circumferential edge of second transparent conductive portion and first groove is maximized
33 insulating layer
33a outer circumferential edge of insulating layer
50, 50A to 50D photoelectric conversion cell
90A first groove
90B second groove
90E end portion of first groove
100, 200, 300 photoelectric conversion element
112 transparent conductive layer (conductive layer)
112X first transparent conductive layer (first conductive layer)
112Y second transparent conductive layer (second conductive layer)
112a outer circumferential edge of conductive layer
W width between outer circumferential edge of second transparent conductive portion and first groove
W1 width between outer circumferential edge of second transparent conductive portion and outer circumferential edge of insulating layer (or precursor thereof)
Wmax maximum value of W

The invention claimed is:
1. A photoelectric conversion element, comprising:
a first substrate;
a conductive layer provided on one surface of the first substrate, the conductive layer including a first conductive layer which includes at least one first conductive portion, and a second conductive layer which is provided on the outside of the first conductive layer, and includes at least one second conductive portion;

TABLE 1

|  | Exposure width of second transparent conductive layer (mm) | State of second transparent conductive layer covered with insulating layer | Durability Retention rate of photoelectric conversion efficiency (%) | Electrostatic charge characteristics Initial surface potential (Comparative Example 1 = 100) |
|---|---|---|---|---|
| Example 1 | 0.1 | Partially covered | 80 | 76 |
| Example 2 | 0.3 | Partially covered | 78 | 71 |
| Example 3 | 0.5 | Partially covered | 74 | 70 |
| Comparative Example 1 | 0 | Entirely covered | 80 | 100 |
| Comparative Example 2 | 1.0 | Not covered | 20 | 69 |

As shown in Table 1, the modules of Examples 1 to 3 satisfied the acceptance criterion, in both of the durability wherein the photoelectric conversion element has at least one photoelectric conversion cell, wherein the photoelectric conversion cell includes,
the first conductive portion,
a second substrate facing the first conductive portion, and
a ring-shaped sealing portion joining the first substrate and the second substrate,
the first conductive layer and the second conductive layer are separated from each other via a first groove,
the photoelectric conversion element includes an insulating layer,
the insulating layer is provided to overlap with the sealing portion between the sealing portion of the at least one photoelectric conversion cell and the first substrate,
an outer circumferential edge of the insulating layer is provided on the outside from the sealing portion to surround the entire sealing portion of the at least one photoelectric conversion cell, in a plan view showing the one surface of the first substrate,
a portion of the first conductive layer protrudes outward from the sealing portion,
the insulating layer covers and hides the portion of the first conductive layer, which protrudes outward from the sealing portion, the portion of the first conductive layer is located on the inside of the outer circumferential edge of the insulating layer and on the outside of the sealing portion, the first groove is partially or entirely located on an outer side of the sealing portion, the insulating layer enters the first groove located on the outer side of the sealing portion and covers a part of the second conductive layer, and
the rest of the second conductive layer is exposed from the insulating layer.

2. The photoelectric conversion element according to claim 1,
wherein an end portion of the first groove reaches an outer circumferential edge of the conductive layer, and
the insulating layer also enters the end portion of the first groove.

3. The photoelectric conversion element according to claim 1, comprising a plurality of the photoelectric conversion cells, and
a second groove separating the first conductive portions adjacent to each other to form the same number of first conductive portions as the number of photoelectric conversion cells together with the first groove is formed in the first conductive layer, and the insulating layer also enters the second groove.

4. The photoelectric conversion element according to claim 1,
wherein the insulating layer enters the entire first groove.

5. The photoelectric conversion element according to claim 1,
wherein the following relation is satisfied:
W1/Wmax is 0.1 or more,
wherein Wmax is the largest width between an outer circumferential edge of the second conductive portion and the first groove, and W1 is a width of the exposed second conductive portion.

6. The photoelectric conversion element according to claim 1,
wherein the insulating layer covers and hides the entire portion of the first conductive layer, which protrudes to the outside of the sealing portion, on the outside of the sealing portion.

* * * * *